US009754959B2

(12) United States Patent
Yun et al.

(10) Patent No.: US 9,754,959 B2
(45) Date of Patent: Sep. 5, 2017

(54) NON-VOLATILE SEMICONDUCTOR DEVICES

(71) Applicant: SAMSUNG ELECTRONICS CO., LTD., Suwon-si, Gyeonggi-Do (KR)

(72) Inventors: Ju-Mi Yun, Pocheon-si (KR); Young-Jin Noh, Suwon-si (KR); Kwang-Min Park, Seoul (KR); Jae-Young Ahn, Seongnam-si (KR); Guk-Hyon Yon, Hwaseong-si (KR); Dong-Chul Yoo, Seongnam-si (KR); Joong-Yun Ra, Seongnam-si (KR); Young-Seon Son, Hwaseong-si (KR); Jeon-Il Lee, Suwon-si (KR); Hun-Hyeong Lim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/963,987

(22) Filed: Dec. 9, 2015

(65) Prior Publication Data
US 2016/0172372 A1 Jun. 16, 2016

(30) Foreign Application Priority Data
Dec. 10, 2014 (KR) .................. 10-2014-0177547

(51) Int. Cl.
*H01L 29/788* (2006.01)
*H01L 27/11582* (2017.01)
*H01L 27/11556* (2017.01)
*H01L 29/51* (2006.01)
*H01L 21/28* (2006.01)

(52) U.S. Cl.
CPC .. *H01L 27/11582* (2013.01); *H01L 21/28273* (2013.01); *H01L 21/28282* (2013.01); *H01L 27/11556* (2013.01); *H01L 29/513* (2013.01); *H01L 29/518* (2013.01); *H01L 29/7883* (2013.01)

(58) Field of Classification Search
USPC ...... 257/314–326, E27.078, E29.3–E29.309, 257/255–266, E21.179–E21.182, 257/E21.209–E21.21, E21.422, E21.423, 257/E21.679–E21.694, 225–234, 390, 257/E27.073, E21.662, E21.666–E21.678
See application file for complete search history.

(56) References Cited

U.S. PATENT DOCUMENTS 7,977,735 B2   7/2011 Lai et al.
8,426,302 B2   4/2013 Matsushita et al.
(Continued)

FOREIGN PATENT DOCUMENTS

KR   1020030084110   11/2003
KR   100652433      11/2006

*Primary Examiner* — Tram H Nguyen
(74) *Attorney, Agent, or Firm* — F. Chau & Associates, LLC

(57) ABSTRACT

A semiconductor device is provided as follows. A tunnel insulation layer is disposed on a substrate. The tunnel insulation layer includes a first silicon oxide layer, a second silicon oxide layer, and a silicon layer interposed between the first silicon oxide layer and the second silicon oxide layer. The silicon layer has a thickness smaller than a thickness of each of the first silicon oxide layer and the second silicon oxide layer. A gate pattern is disposed on the tunnel insulation layer.

17 Claims, 31 Drawing Sheets

(56) References Cited

U.S. PATENT DOCUMENTS

| | | |
|---|---|---|
| 2003/0203113 A1 | 10/2003 | Cho et al. |
| 2003/0203572 A1 | 10/2003 | Yoshino |
| 2006/0033146 A1* | 2/2006 | Wang .................. G11C 16/0416 257/315 |
| 2007/0054448 A1 | 3/2007 | Choi et al. |
| 2007/0247923 A1* | 10/2007 | Ding .................. G11C 16/0475 365/185.29 |
| 2008/0173930 A1* | 7/2008 | Watanabe ......... H01L 21/28273 257/321 |
| 2009/0101967 A1 | 4/2009 | Lai et al. |
| 2009/0179252 A1* | 7/2009 | Baek ................. H01L 21/28273 257/321 |
| 2010/0155821 A1 | 6/2010 | Lai et al. |
| 2011/0001183 A1* | 1/2011 | Yoo ................... H01L 21/02145 257/324 |
| 2012/0319172 A1 | 12/2012 | Ramaswamy et al. |
| 2013/0087849 A1 | 4/2013 | Meotto et al. |
| 2014/0167133 A1 | 6/2014 | Hirano et al. |

\* cited by examiner

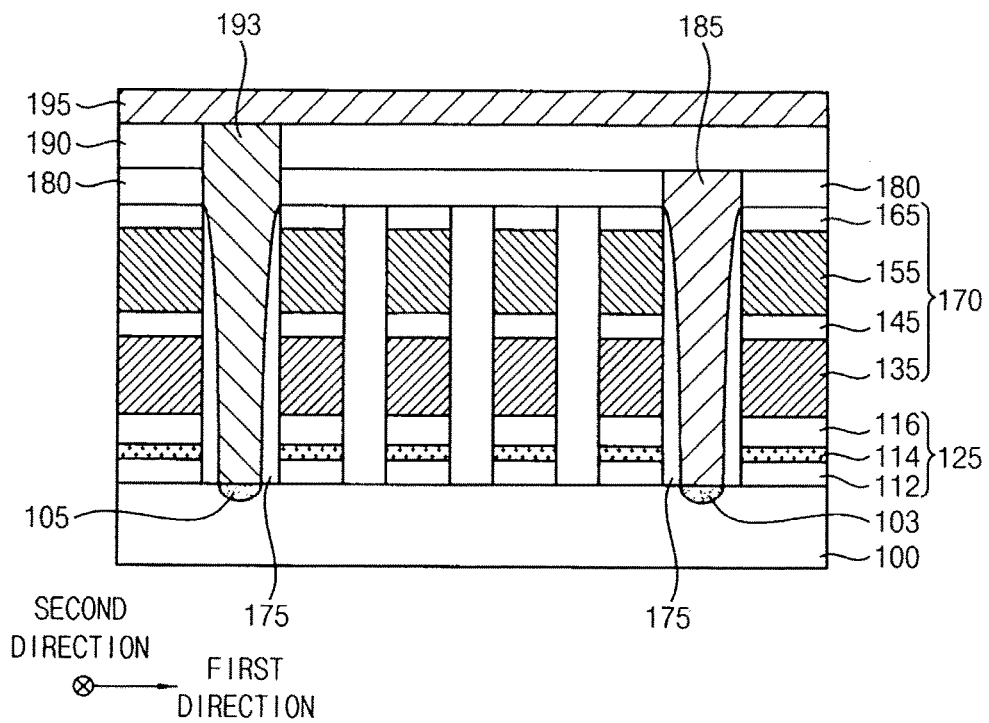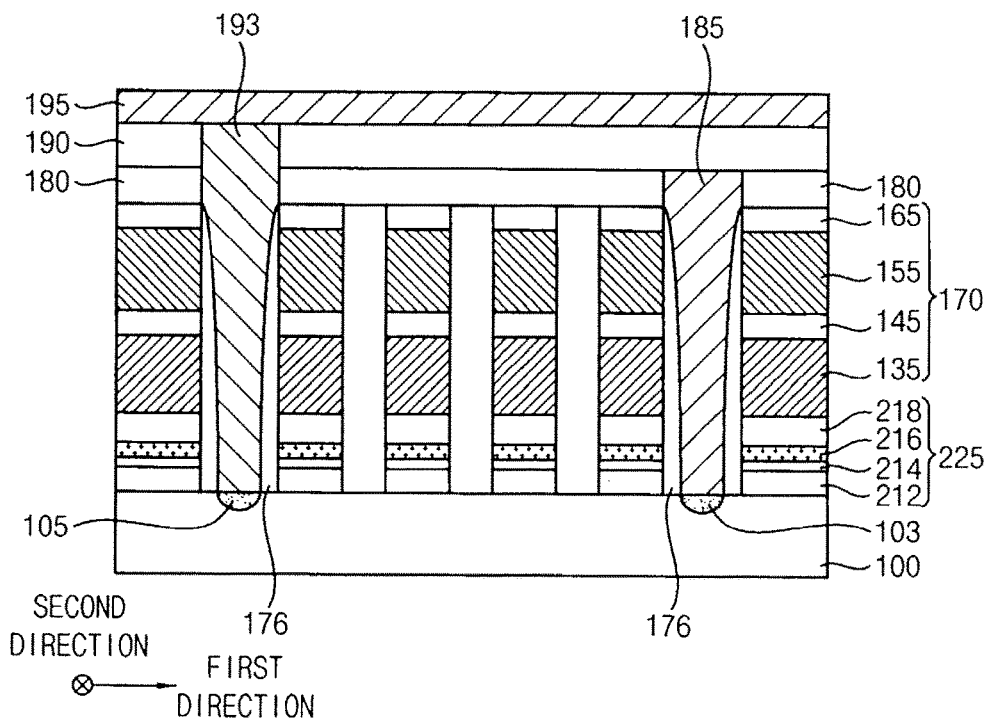

SECOND
DIRECTION
⊗ → FIRST
DIRECTION

SECOND
DIRECTION
⊗ → FIRST
DIRECTION

FIG. 22
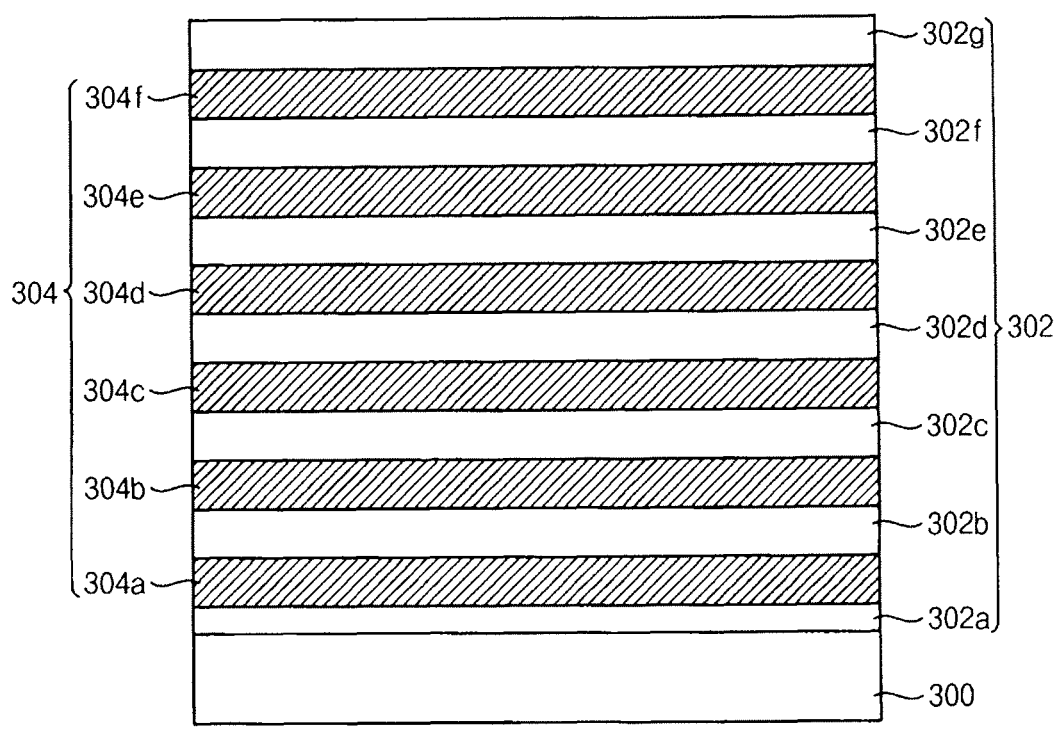
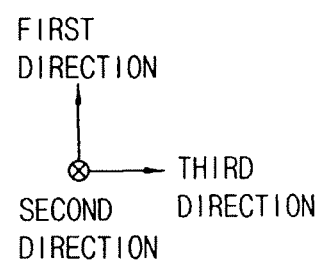

FIG. 23
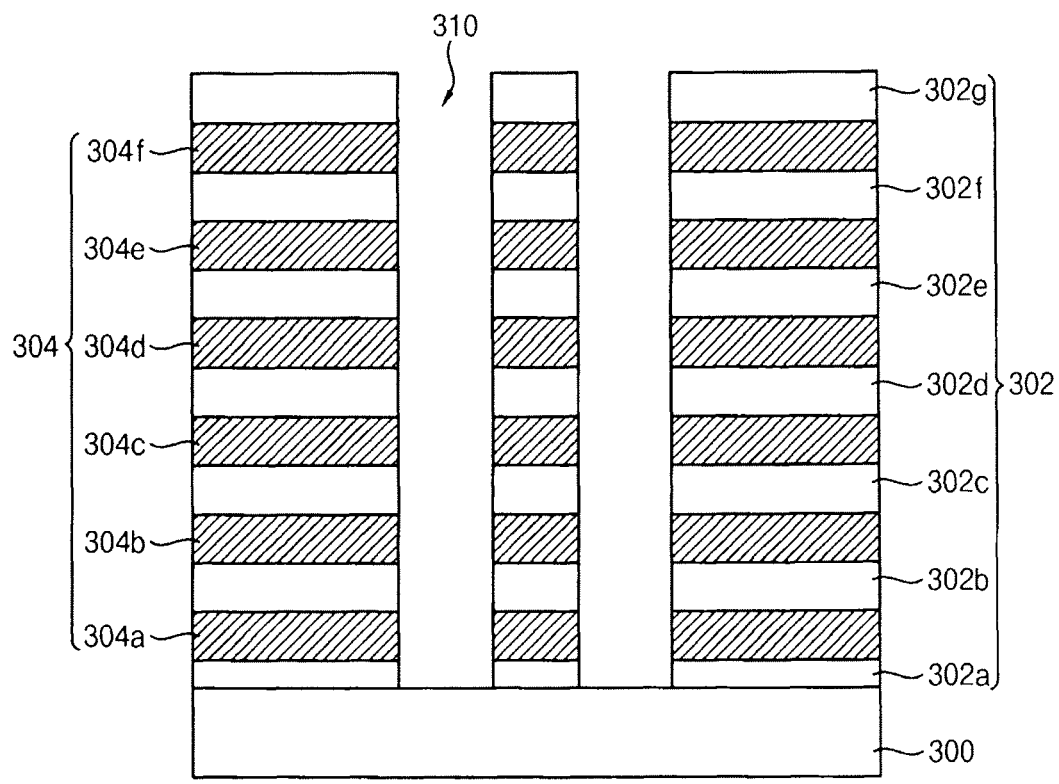
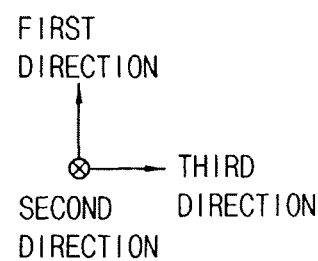

FIG. 32
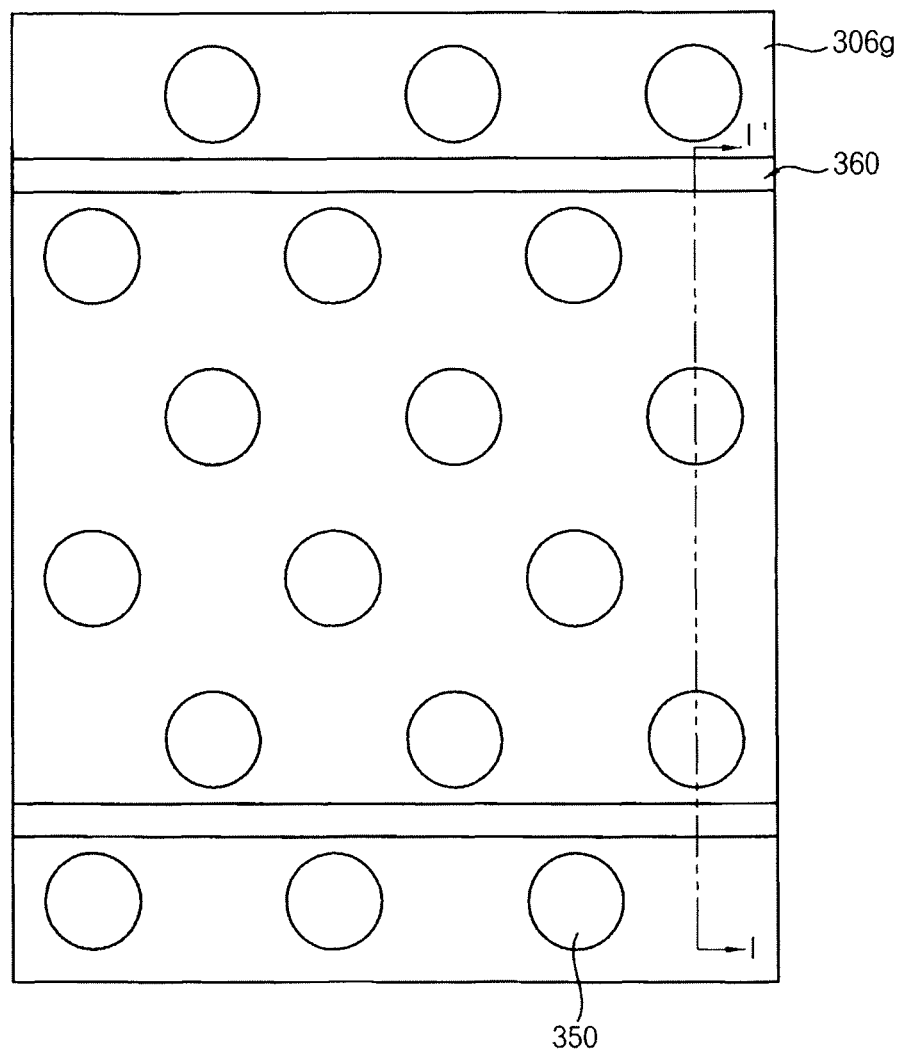
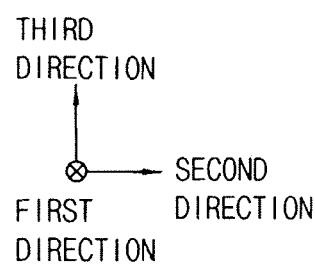

NON-VOLATILE SEMICONDUCTOR DEVICES

CROSS-REFERENCE TO RELATED APPLICATION

This application claims priority under 35 U.S.C. §119 to Korean Patent Application No. 10-2014-0177547, filed on Dec. 10, 2014 in the Korean Intellectual Property Office (KIPO), the disclosure of which is incorporated by reference herein in its entirety.

TECHNICAL FIELD

The present inventive concept relates to semiconductor devices and manufacturing the same.

DISCUSSION OF RELATED ART

Non-volatile semiconductor devices may include a floating gate-type flash memory device or a charge trap-type flash memory device. In the flash memory device, a tunnel insulation layer may be interposed between a channel and a gate to control an electron movement. To achieve a reliable operation of the semiconductor device, operational and mechanical stability in the tunnel insulation layer may be needed.

SUMMARY

According to an exemplary embodiment of the present inventive concept, a semiconductor device is provided as follows. A tunnel insulation layer is disposed on a substrate. The tunnel insulation layer includes a first silicon oxide layer, a second silicon oxide layer, and a silicon layer interposed between the first silicon oxide layer and the second silicon oxide layer. The silicon layer has a thickness smaller than a thickness of each of the first silicon oxide layer and the second silicon oxide layer. A gate pattern is disposed on the tunnel insulation layer.

According to an exemplary embodiment of the present inventive concept, a semiconductor device is provided as follows. A plurality of insulating interlayers and a plurality of gate lines are disposed on a substrate. Each insulating interlayer and each gate line are alternately and repeatedly stacked on the substrate. A channel hole penetrates through the insulating interlayers and the gate lines. A charge trap layer is disposed on a sidewall of the channel hole. A tunnel insulation layer is disposed on the charge trap layer. The tunnel insulation layer includes a first silicon oxide layer, a second silicon oxide layer, and a silicon layer interposed between the first silicon oxide layer and the second silicon oxide layer. The silicon layer has a thickness smaller than a thickness of each of the first silicon oxide layer and the second silicon oxide layer. A channel is disposed on the tunnel insulation layer and in the channel hole.

According to an exemplary embodiment of the present inventive concept, a method of manufacturing a semiconductor device is provided as follows. A first silicon oxide layer is formed on a substrate. A first silicon precursor and a first hydrogen flow are provided to form a silicon layer on the first silicon oxide layer. A second silicon precursor, an oxygen flow and a second hydrogen flow are provided to form a second silicon oxide layer on the silicon layer. A plurality of gate patterns is formed on the second silicon oxide layer.

According to an exemplary embodiment of the present inventive concept, a method of manufacturing a semiconductor device is provided as follows. A plurality of insulating interlayers and a plurality of sacrificial layers are formed on a substrate to form a mold structure. Each insulating interlayer and each sacrificial layer are alternately and repeatedly stacked on the substrate. A channel hole is formed, penetrating through the mold structure. A charge trap layer is formed on a sidewall of the channel hole. A first silicon oxide layer is formed on the charge trap layer. A first silicon precursor and a first hydrogen flow are provided to form a silicon layer on the first silicon oxide layer. A second silicon precursor, an oxygen flow and a second hydrogen flow are provided to form a second silicon oxide layer on the silicon layer. A channel is formed on the second silicon oxide layer. The channel is disposed in the channel hole. A plurality of gate lines is formed by replacing each sacrificial layer with each gate line.

According to an exemplary embodiment of the present inventive concept, a semiconductor device is provided as follows. A tunneling insulation layer is disposed on a substrate having hole carriers, and the tunneling insulation layer includes a first silicon oxide layer, a second silicon oxide layer, and a silicon layer interposed between the first silicon oxide layer and the second silicon oxide layer. A charge storage layer pattern is disposed on the tunneling insulation layer. A gate electrode is disposed on the charge storage layer pattern. The hole carriers pass through the tunneling insulating layer to the charge storage layer at an erase voltage.

BRIEF DESCRIPTION OF THE DRAWINGS

These and other features of the inventive concept will become more apparent by describing in detail exemplary embodiments thereof with reference to the accompanying drawings of which:

FIGS. 1 and 2 are cross-sectional views of semiconductor devices in accordance with exemplary embodiments of the present inventive concept;

FIGS. 22 to 37 are cross-sectional views and top plan views of a method of manufacturing a semiconductor device in accordance with exemplary embodiments of the present inventive concept;

Figure 3:
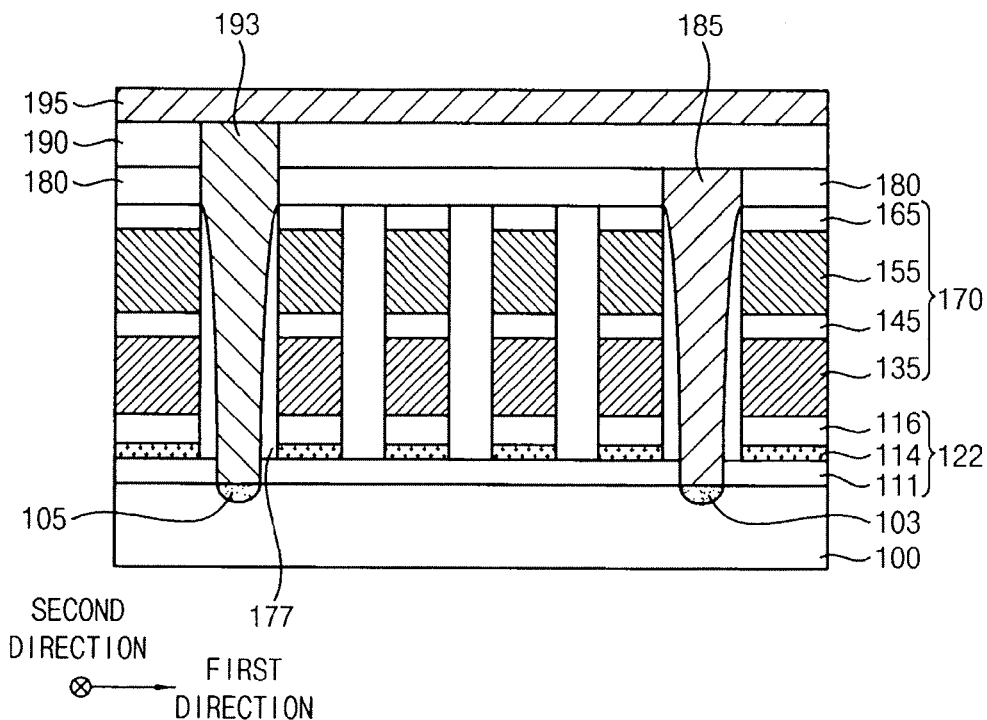
FIGS. 3 and 4 are cross-sectional views of semiconductor devices in accordance with exemplary embodiments of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIGS. 1 and 2 are cross-sectional views illustrating semiconductor devices in accordance with exemplary embodiments.

Two directions parallel to a top surface of a substrate and crossing each other are defined as a first direction and a second direction. For example, the first direction and the second direction are perpendicular to each other. The definitions of the first and second directions are substantially the same throughout FIGS. 3 to 20.

Referring to FIG. 1, the semiconductor device may include a tunnel insulation layer pattern 125, and a gate pattern 170 disposed on the tunnel insulation layer pattern 125. A gate structure may include the tunnel insulation layer pattern 125 and the gate pattern 170.

In exemplary embodiments, a plurality of the gate structures may be arranged along the first direction. Each of the gate structures may extend in the second direction.

A substrate 100 may include a semiconductor substrate such as a silicon substrate, a germanium substrate, a silicon-germanium substrate, a silicon-on-insulator (SOI) substrate or a germanium-on-insulator (GOI) substrate. In some exemplary embodiments, the substrate 100 may include a group III-V compound such as GaP, GaAs or GaSb. The substrate 100 may further include a well doped with p-type or n-type impurities.

The substrate 100 may be divided into an active region and a field region by a plurality of isolation layers (not illustrated) arranged along the second direction, each of which may extend in the first direction. FIGS. 1 to 20 are cross-sectional views of structures formed on the active region.

The substrate 100 may be also divided into a cell region on which memory cells may be arranged, and a peripheral circuit region. For example, in FIGS. 1 to 4, a central region of the substrate 100 on which four gate structures having a first width are arranged may correspond to the cell region. Both peripheral regions on which the gate structures having a second width are formed may correspond to the peripheral circuit region. The first width may be smaller than the second width.

FIGS. 1 to 4 illustrate that the four gate structures or the four memory cells are arranged on the cell region. The present inventive concept is not limited thereto. For example, 2n (n is a positive integer), e.g., 8 or 16 gate structures may be arranged on the cell region.

The tunnel insulation layer pattern 125 may include a first silicon oxide layer pattern 112, a silicon layer pattern 114 and a second silicon oxide layer pattern 116 sequentially stacked on a top surface of the substrate 100. Thus, the tunnel insulation layer pattern 125 may have an oxide-silicon-oxide (OSO) layered structure.

In exemplary embodiments, the silicon layer pattern 114 may have a thickness smaller than each thickness of the first and second silicon oxide layer patterns 112 and 116. In some exemplary embodiments, the second silicon oxide layer pattern 116 may have a thickness greater than that of the first silicon oxide layer pattern 112

The gate pattern 170 may include a floating gate 135, a dielectric layer pattern 145, a control gate 155 and a gate mask 165. Accordingly, the semiconductor device may be provided as a non-volatile floating gate-type flash memory device.

The floating gate 135 may include doped polysilicon, for example. A charge for determining a logic state may be stored in the floating gate 135.

The dielectric layer pattern 145 may have a single layered structure or a multi-layered structure including an oxide layer and/or a nitride layer. For example, the dielectric layer pattern 145 may have an oxide-nitride-oxide (ONO) layered structure. In some exemplary embodiments, the dielectric layer pattern 145 may include a high dielectric constant (high-k) metal oxide such as hafnium oxide, zirconium oxide, aluminum oxide, tantalum oxide, titanium oxide, or the like.

The control gate 155 may include a conductive material such as doped polysilicon, metal, metal nitride or metal silicide. In some exemplary embodiments, the control gate 155 may include doped polysilicon at a lower portion thereof, and may include the metal silicide at an upper portion thereof. The control gate 155 may serve as a word line of the semiconductor device, for example.

The gate mask 165 may include silicon nitride or silicon oxynitride, for example.

FIGS. 1 to 4 illustrate that the gate structure of the cell region and the gate structure of the peripheral circuit region have the same stack structure. However, in an exemplary embodiment, the control gate 155 and the floating gate 135 included in the gate structure on the peripheral circuit region may be partially in contact with each other, or may be electrically connected to each other.

A gate spacer 175 may be formed on a sidewall of the gate structure. The gate spacer 175 may include silicon nitride, for example.

A first impurity region 103 and a second impurity region 105 may be formed in upper portions of the substrate 100 and be adjacent to the gate structures. For example, the first and second impurity regions 103 and 105 may be formed in upper portions of the substrate 100 and be between the cell region and the peripheral circuit region.

A first insulating interlayer 180 may be formed on the substrate 100 to cover the gate structures. A first plug 185 may penetrate through the first insulating interlayer 180, and may be in contact with or electrically connected to the first impurity region 103. In exemplary embodiments, the first plug 185 may serve as a common source line (CSL) or a CSL contact.

A second insulating interlayer 190 may be formed on the first insulating interlayer 180 to cover the first plug 185. A second plug 193 may penetrate through the second and first insulating interlayers 190 and 180, and may be in contact with or electrically connected to the second impurity region 105. In exemplary embodiments, the second plug 193 may serve as a bit line contact.

The first and second insulating interlayers 180 and 190 may include a silicon oxide-based material such as plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like.

The first and second plugs 185 and 193 may include a conductive material such as a metal, a metal nitride or a metal silicide. The first and second plugs 185 and 193 may be self-aligned with the gate spacer 175.

For example, a bit line 195 electrically connected to the second plug 193 may be disposed on the second insulating interlayer 190. The bit line 195 may extend in the second direction. The bit line 195 may include a conductive material such as a metal, a metal nitride or a metal silicide.

FIG. 1 illustrates that the semiconductor device has a floating gate-type structure. The present inventive concept is not limited thereto. For example, the semiconductor device may have a charge trap-type structure. In this case, the floating gate 135, the dielectric layer pattern 145 and the control gate 155 included in the gate pattern 170 may be replaced with a charge trap layer pattern, a blocking layer pattern and a gate electrode, respectively.

The charge trap layer pattern may include nitride such as silicon nitride. The blocking layer pattern may include silicon oxide, or a high-k metal oxide such as hafnium oxide, titanium oxide, tantalum oxide, zirconium oxide, aluminum oxide, etc. The gate electrode may include a conductive material such as metal, metal nitride or metal silicide.

Hereinafter, detailed descriptions are provided based on implementations that the gate pattern includes the floating gate 135, the dielectric layer pattern 145 and the control gate 155.

As described above, the tunnel insulation layer pattern 125 included in a floating gate-type or a charge trap-type memory device may have the OSO layered structure. The tunnel insulation layer pattern 125 may include the silicon layer 112 as an intermediate layer which is interposed between the first silicon oxide layer pattern 112 and a second silicon oxide layer pattern 116. The silicon layer 112 as the intermediate layer of the tunnel insulation layer pattern 125 may have a small valence band offset at the junction between the silicon layer 112 and the oxide layers 112 and 116 such that an erase voltage required to erase an electron stored in the floating gate or the charge trap layer pattern using a hole injection may be reduced.

In a comparative example, an ONO (oxide-nitride (or oxynitride)-oxide) layered structure may be used as the tunnel insulation layer pattern 125 to decrease an erase voltage. In this case, greater a nitrogen content in the nitride layer (or oxynitride layer), smaller the valence band offset and the erase voltage. However, the nitride layer may have a charge trap property, and thus a charge that may be designated to be stored in the floating gate or the charge trap layer pattern may be lost. Further, such charge trap in the nitride layer may bend the valence band at the junction between the oxide layer and the nitride layer, and thus the erase voltage may be increased.

However, according to exemplary embodiments, the silicon layer having a low charge trap property may be employed as the intermediate layer of the tunnel insulation layer pattern 125 instead of the nitride layer or the oxynitride layer. Thus, the valance band offset may reduced without causing a charge loss. Therefore, an erase operation may be performed using a small erase voltage in the gate structure.

Additionally, according to exemplary embodiments, the thickness of the silicon layer pattern 114 may be smaller than the each thickness of the first and second silicon oxide layer patterns 112 and 116. Thus, the thicknesses of the silicon oxide layer patterns 112 and 116 that may be substantially charge trap-free or may have the least charge trap property may be increased within a predetermined thickness of the tunnel insulation layer pattern 125 while the band-gap may be controlled by the thin-layered silicon layer pattern 114.

Referring to FIG. 2, a tunnel insulation layer pattern 225 may further include a silicon oxynitride layer pattern in the tunnel insulation layer pattern 125 of FIG. 1. In exemplary embodiments, the tunnel insulation layer pattern 225 may include a first silicon oxide layer pattern 212, a silicon oxynitride layer pattern 214, a silicon layer pattern 216 and a second silicon oxide layer pattern 218 sequentially stacked on the top surface of the substrate 100.

In this case, a gate spacer 176 may be formed on sidewalls of the gate pattern 170 and the tunnel insulation layer pattern 225 additionally including the silicon oxynitride layer pattern 214.

In exemplary embodiments, a thickness of the silicon oxynitride layer pattern 214 may be smaller than that of the silicon layer pattern 216. In some exemplary embodiments, the thickness of the silicon oxynitride layer pattern 214 may be smaller than each thickness of the first silicon oxide layer pattern 212, the silicon layer pattern 216 and the second silicon oxide layer pattern 218.

Accordingly, the valence band offset and the erase voltage may be further reduced by an addition of nitrogen ingredients, while minimizing a charge trap possibly caused by the silicon oxynitride layer pattern 214.

In some exemplary embodiments, a silicon oxynitride layer pattern may be interposed between the second silicon oxide layer pattern 218 and the silicon layer pattern 216. In some exemplary embodiments, a silicon oxynitride layer pattern may be interposed between the first silicon oxide layer pattern 212 and the silicon layer pattern 216, and/or between the second silicon oxide layer pattern 218 and the silicon layer pattern 216.

Figure 4:
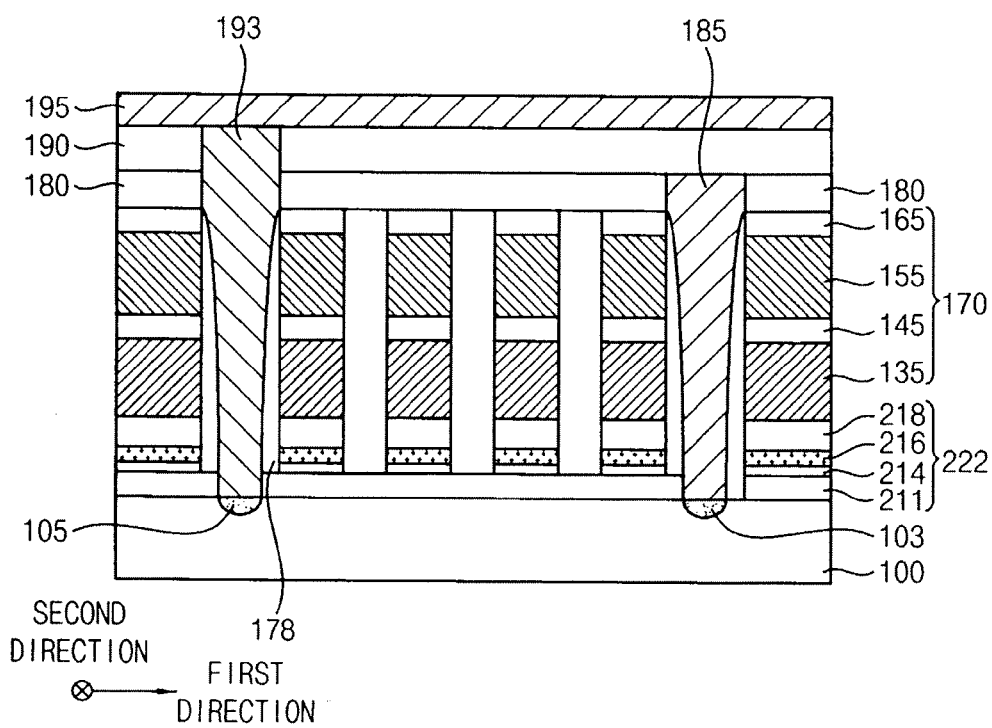

FIGS. 3 and 4 are cross-sectional views illustrating semiconductor devices in accordance with exemplary embodiments.

The semiconductor devices of FIGS. 3 and 4 may have elements and/or structures substantially the same as or similar to those of the semiconductor devices of FIGS. 1 and 2 except for a structure of a tunnel insulation layer pattern. Thus, detailed descriptions on the repeated elements and structures are omitted herein.

Referring to FIG. 3, a tunnel insulation layer pattern 122 may not be completely separated under a plurality of gate patterns 170 disposed on a cell region, and may continuously extend on the cell region.

For example, a portion of the tunnel insulation layer pattern 122 between the gate patterns 170 included in gate structures serving as memory cells may have a thickness smaller than a thickness of a portion of the tunnel insulation layer pattern 122 under the gate pattern 170.

In some exemplary embodiments, a second silicon layer pattern 116 and a silicon layer pattern 114 may be patterned per each cell as the gate pattern 170 and as shown in FIG. 1. However, a first silicon oxide layer 111 may be continuous, without being patterned per each cell, under the gate patterns 170 in the cell region. For example, the first silicon oxide layer 111 may be provided commonly for the plurality of the gate patterns 170 in the cell region.

In this case, a gate spacer 177 may be formed on sidewalls of the gate pattern 170, the second silicon oxide layer pattern 116 and the silicon layer pattern 114, and may be formed on a top surface of the first silicon oxide layer 111.

A first plug 185 and a second plug 193 may penetrate through insulating interlayers 180 and 190, and the first silicon oxide layer 111 to be in contact with or electrically connected to a first impurity region 103 and a second impurity region 105, respectively.

As described above, the second silicon oxide layer pattern 116 and the silicon layer pattern 114 may be patterned in a similar manner to the gate pattern 170 in the cell region so that an operational property of each cell may be achieved. The first silicon oxide layer 111 may be provided commonly on the cell region so that an etching amount for the formation of the gate structures may be reduced, and an etching damage of the substrate 100 serving as a channel may be prevented.

Referring to FIG. 4 and FIG. 2, a tunnel insulation layer pattern 222 may further include a silicon oxynitride layer pattern 214. For example, the silicon oxynitride layer pattern 214 may be interposed between a first silicon oxide layer 211 and a silicon layer pattern 216.

In some exemplary embodiments, the silicon oxynitride layer pattern 214 may be separated per each cell together with a second silicon oxide layer pattern 218 and the silicon layer pattern 216. The first silicon oxide layer 211 may be continuous under the gate patterns in the cell region, and may be provided commonly for a plurality of cells in the cell region.

In some exemplary embodiments, the silicon oxynitride layer pattern may be interposed between the second silicon oxide layer pattern 218 and the silicon layer pattern 216.

A gate spacer 178 may be formed on sidewalls of the gate pattern 170, the second silicon oxide layer pattern 218, the silicon layer pattern 216, the silicon oxynitride layer pattern 214, and the first silicon oxide layer 211.

FIGS. 5 to 10 are cross-sectional views showing a method of manufacturing a semiconductor device in accordance with exemplary embodiments of the present inventive concept. For example, FIGS. 5 to 10 illustrate a method of manufacturing the semiconductor device of FIG. 1.

Figure 5:
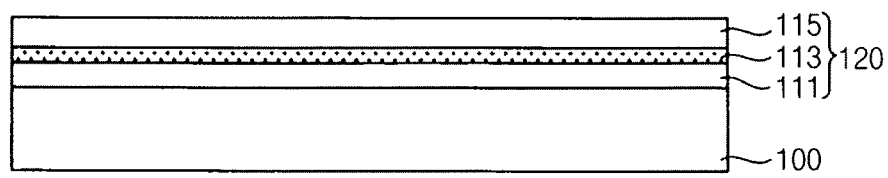
FIGS. 5 to 10 are cross-sectional views of a method of manufacturing a semiconductor device in accordance with exemplary embodiments of the present inventive concept.

Referring to FIG. 5, a first silicon oxide layer 111, a silicon layer 113 and a second silicon oxide layer 115 may be sequentially formed on a substrate 100 to form a tunnel insulation layer 120.

In exemplary embodiments, the first silicon oxide layer 111, the silicon layer 113 and the second silicon oxide layer 115 may be formed by an in-situ deposition process in the same chamber. In some exemplary embodiments, the first silicon oxide layer 111, the silicon layer 113 and the second silicon oxide layer 115 may be formed by an atomic layer deposition (ALD) process.

For example, a silicon precursor and an oxygen source may be provided on the substrate 100 in the ALD process to form the first silicon oxide layer 111.

Subsequently, a first silicon precursor and a first hydrogen flow may be provided on the first silicon oxide layer 111 so that the silicon layer 113 may be grown from the first silicon oxide layer 111.

In some exemplary embodiments, a chlorosilane-based material may be used as the first silicon precursor. For example, the first silicon precursor may include hexachlorodisilane (HCD: $Si_2Cl_6$), trichlorosilane ($SiCl_3H$), trimethylchlorosilane ($Si(CH_3)_3Cl$) or dimethylchlorosilane ($Si(CH_3)_2Cl_2$). These may be used alone or in a combination thereof.

In exemplary embodiments, HCD may be solely used as the first silicon precursor for the formation of the silicon layer 113 having uniform layer properties and uniform thickness.

The first silicon oxide layer 111 may provide an adsorption site to which the first silicon precursor may be fixed. Thus, the first silicon oxide layer 111 may substantially serve as a seed layer for the silicon layer 113.

For example, a dangling bond formed on the first silicon oxide layer 111 may serve as the adsorption site for the first silicon precursor. Accordingly, when HCD is provided in a process chamber, HCD may be chemically adsorbed on the first silicon oxide layer 111 so that a preliminary silicon layer having an atomic layer-leveled thin layer structure may be formed.

When a temperature in the process chamber may be increased to a range of about 500° C. to about 700° C., a bond between silicon atoms of HCD may be dissociated. Subsequently, as the first hydrogen flow may be introduced in the process chamber, a Si—Cl bond may be dissociated. Accordingly, the silicon layer 113 having a thin atomic layer structure may be formed.

A growth rate and a thickness of the silicon layer 113 may be controlled by adjusting a flow rate of the first silicon precursor and/or the first hydrogen flow. In exemplary embodiments, the silicon layer 113 may be formed to be thinner than the first silicon oxide layer 111.

Subsequently, a second silicon precursor, an oxygen flow and a second hydrogen flow may be provided on the silicon layer 113 to form the second silicon oxide layer 115.

For example, the chlorosilane-based material substantially the same as or similar to the first silicon precursor may be used as the second silicon precursor.

In exemplary embodiments, the second silicon oxide layer 115 may be formed in a process condition for minimizing oxidation of the silicon layer 113.

For example, a supply time of the second silicon precursor may be controlled to be greater than a supply time of the oxygen flow and the second hydrogen flow so that the silicon layer 113 may be prevented from being oxidized. In some exemplary embodiments, the supply time of the second silicon precursor may be at least twice the supply time of the oxygen flow and the second hydrogen flow.

In some exemplary embodiments, the supply time and a flow rate of the second silicon precursor may be controlled so that the second silicon oxide layer 115 may be thicker than each of the silicon layer 113 and the first silicon oxide layer 111.

The tunnel insulation layer 120 having an OSO-layered structure may be formed on the substrate 100 by performing the above-described processes.

Figure 6:
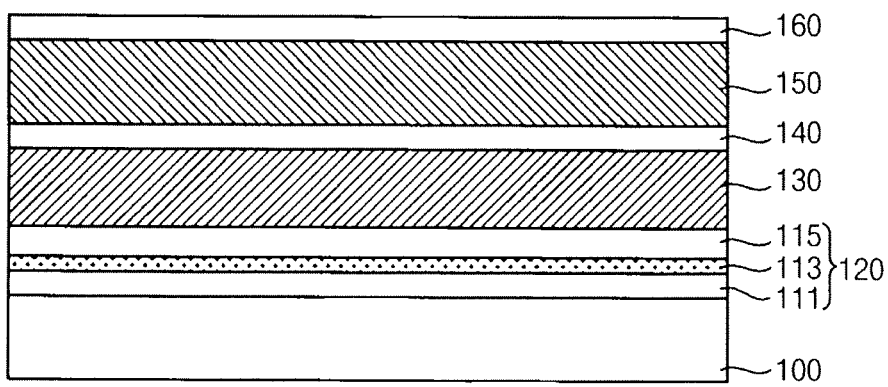

Referring to FIG. 6, a floating gate layer 130, a dielectric layer 140, a control gate layer 150 and a gate mask layer 160 may be sequentially formed on the tunnel insulation layer 120.

The floating gate layer 130 may be formed of doped polysilicon, for example. The dielectric layer 140 may be formed as a single layered structure including an oxide layer or a nitride layer, or a multi-layered structure such as an ONO-layered structure. The dielectric layer 140 may be formed of a metal oxide having a high dielectric constant (high-k). The control gate layer 150 may be formed of a conductive material such as doped polysilicon, metal, metal nitride, metal silicide, or the like. The gate mask layer 160 may be formed of silicon nitride or silicon oxynitride.

The floating gate layer 130, the dielectric layer 140, the control gate layer 150 and the gate mask layer 160 may be formed by at least one of a chemical vapor deposition (CVD) process, a plasma enhanced chemical vapor deposition (PECVD) process, a sputtering process, a physical vapor deposition (PVD) process and an ALD process.

In some exemplary embodiments, a charge trap layer, a blocking layer and a gate electrode layer may be sequentially formed on the tunnel insulation layer 120 instead of the floating gate layer 130, the dielectric layer 140 and the control gate layer 150.

The charge trap layer may be formed of silicon nitride. The blocking layer may be formed of silicon oxide, or a high-k metal oxide such as hafnium oxide, zirconium oxide, aluminum oxide, tantalum oxide, titanium oxide, or the like. The gate electrode layer may be formed of dope polysilicon, metal, metal nitride or metal silicide, for example.

Hereinafter, detailed descriptions are provided based on implementations that the floating gate layer 130, the dielectric layer 140 and the control gate layer 150 are sequentially formed on the tunnel insulation layer 120.

In some exemplary embodiments, after forming the floating gate layer 130 and before the formation of the dielectric layer 140, the floating gate layer 130, the tunnel insulation layer 120 and an upper portion of the substrate 100 may be sequentially etched along the first direction. Accordingly, trenches (not illustrated) extending in the first direction, and spaced apart from each other along the second direction may be formed in the upper portion of the substrate 100.

Subsequently, isolation layers (not illustrated) filling the trenches may be formed of silicon oxide, for example. The substrate 100 may be divided into active regions and field regions by the isolation layers. The tunnel insulation layer 120 and the floating gate layer 130 may be converted into line patterns extending in the first direction on the active region.

Figure 7:
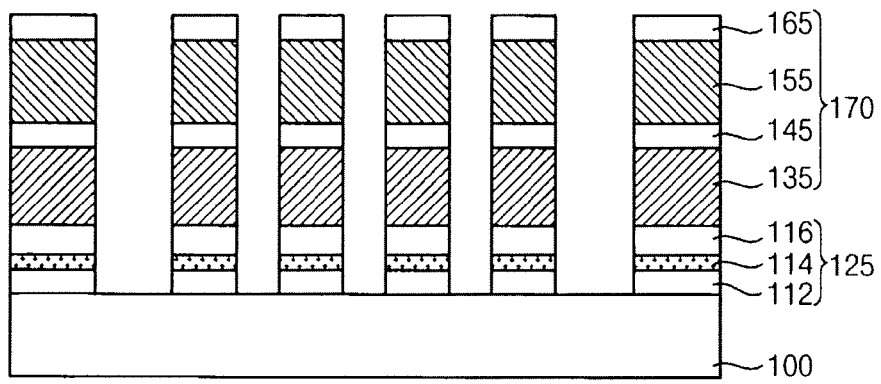

Referring to FIG. 7, the gate mask layer 160, the control gate layer 150, the dielectric layer 140, the floating gate layer 130 and the tunnel insulation layer 120 may be sequentially and partially etched to form a gate pattern 170 and a tunnel insulation layer pattern 125.

For example, the gate mask layer 160 may be partially etched by a photolithography process to form a gate mask 165. The control gate layer 150, the dielectric layer 140, the floating gate layer 130 and the tunnel insulation layer 120 may be sequentially and partially etched using the gate mask 165 as an etching mask to form a control gate 155, a dielectric layer pattern 145, a floating gate 135 and the tunnel insulation layer pattern 125.

Accordingly, the gate pattern 170 including the floating gate 135, the dielectric layer pattern 145, the control gate 155 and the gate mask 165 sequentially stacked on the tunnel insulation layer pattern 125 may be formed. A gate structure including the tunnel insulation layer pattern 125 and the gate pattern 170 may be formed.

In exemplary embodiments, a plurality of the gate structures may be formed along the first direction. For example, a central portion of the substrate 100 may correspond to a cell region, and the gate structures having a first width may be formed in the cell region. In the cell region, the gate structures may be spaced apart from each other at a first distance. The gate structures on the cell region may serve as memory cells. FIG. 7 illustrates four gate structures in the cell region. The present inventive concept is not limited thereto. For example, the number of the gate structures in the cell region may be greater than or smaller than four.

Peripheral portions of the substrate 100 may correspond to a peripheral region. The gate structures formed in the peripheral circuit region may have a second width. In the peripheral circuit region, a gate structures in the cell region and a gate structure in the peripheral region may have a second distance which is greater than the first distance between the gate structures in the cell region.

In some exemplary embodiments, the floating gate 135 and the control gate 155 included in the gate structure in the peripheral circuit region may be in contact with or electrically connected to each other. In this case, in the step of FIG. 6, the floating gate layer 130 and the control gate layer 150 may be connected to each other in the peripheral circuit region using a butting process.

The tunnel insulation layer pattern 125 and the floating gate 135 may each have an island shape on the active region of the substrate 100. The dielectric layer patterns 145, the control gates 155 and the gate mask 165 may extend in the second direction, and may be spaced apart from each other along the first direction.

Figure 8:
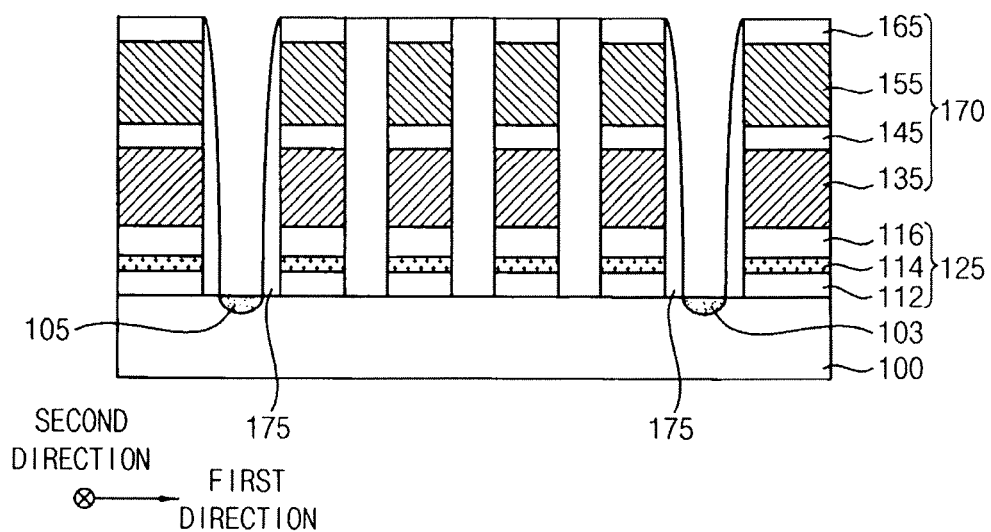

Referring to FIG. 8, a gate spacer 175 may be formed on sidewalls of the gate structures, and an impurity region may be formed in an upper portion of the substrate 100.

For example, a spacer layer covering the gate structures may be formed using silicon nitride, and the spacer layer may be anisotropically etched to form the gate spacer 175.

In some exemplary embodiments, the upper portion of the substrate 100 may be exposed between the gate spacers 175 in the cell region and the peripheral circuit region, because the distance between the gate structures on the cell region and the peripheral circuit region may be relatively large. An ion-implanation process may be performed on the exposed upper portion of the substrate 100 to form a first impurity region 103 and a second impurity region 105. The first and second impurity regions 103 and 105 may each have a linear shape extending in the second direction or an island shape formed in the upper portion of the substrate 100.

Figure 9:
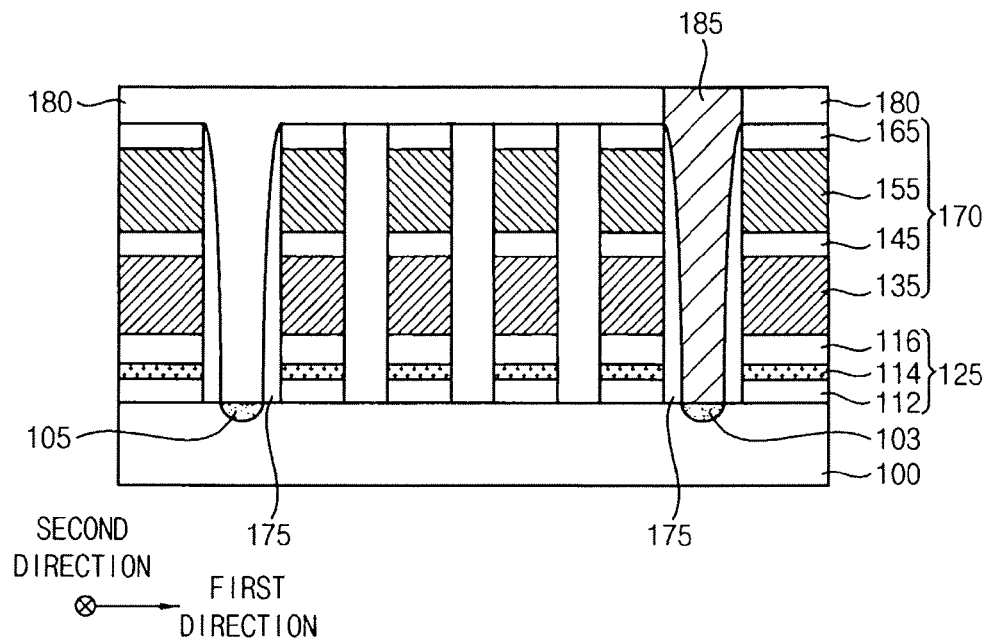

Referring to FIG. 9, a first insulating interlayer 180 covering the gate spacer and the gate structures may be formed on the substrate 100. The first insulating interlayer 180 may be formed of PEOX-based, TEOS-based or silicate glass-based silicon oxide by a CVD process, for example.

A first plug 185 in contact with or electrically connected to the first impurity region 103 may be formed through the first insulating interlayer 180. For example, the first insulating interlayer 180 may be partially removed to form a first contact hole through which the first impurity region 103 may be exposed. A first conductive layer filling the first contact hole may be formed on the first insulating interlayer 180, and an upper portion of the first conductive layer may be planarized by a chemical mechanical polish (CMP) process to form the first plug 185. The first plug 185 may serve as a CSL or a CSL contact of the semiconductor device.

Figure 10:
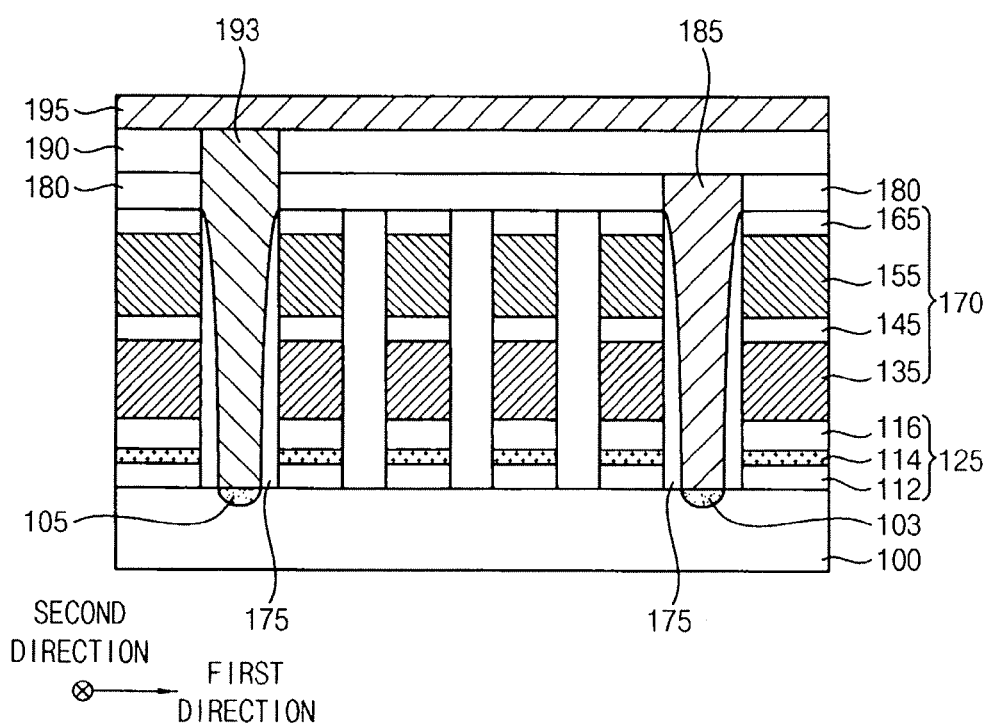

Referring to FIG. 10, a second insulating interlayer 190 covering the first plug 185 may be formed on the first insulating 180. A second contact hole may be formed through the second and first insulating interlayers 190 and 180 to expose the second impurity region 105. A second conductive layer filling the second contact hole may be formed on the second insulating interlayer 190, and an upper portion of the second conductive layer may be planarized by a CMP process to form a second plug 193.

A third conductive layer may be formed on the second insulating interlayer 190 and the second plug 193, and may be patterned to form a bit line 195. For example, the bit line 195 may extend in the first direction. The second plug 193 may be electrically connected to the bit line 195 to serve as a bit line contact.

The second insulating interlayer 190 may be formed of silicon oxide which may be substantially the same as or similar to that of the first insulating interlayer 180. The first to third conductive layers may be formed of metal, metal nitride or metal silicide by a sputtering process or an ALD process. The first and second contact holes may be self-aligned with the gate spacer 175.

Figure 11:
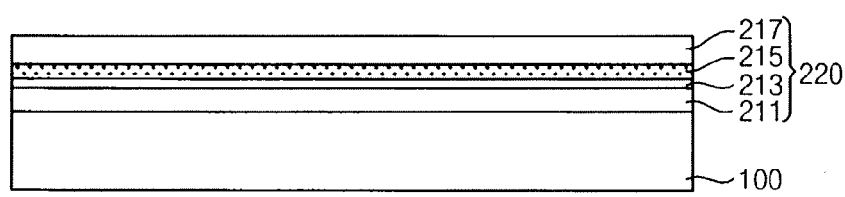
FIGS. 11 and 12 are cross-sectional views of a method of manufacturing a semiconductor device in accordance with exemplary embodiments of the present inventive concept.
Figure 12:
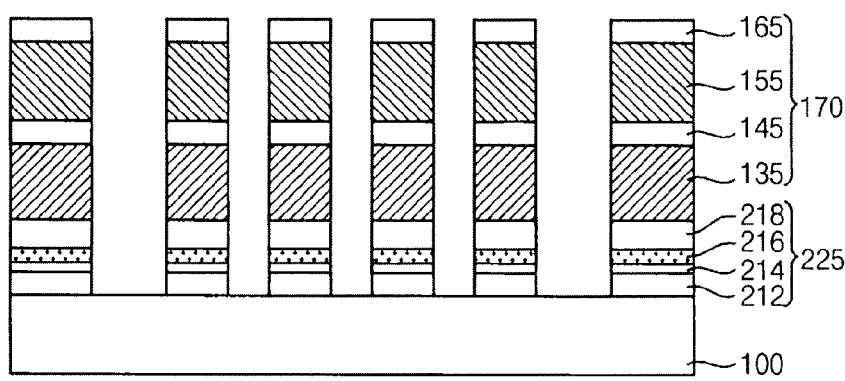

FIGS. 11 and 12 are cross-sectional views of a method of manufacturing a semiconductor device in accordance with some exemplary embodiments of the present inventive concept.

For example, FIGS. 11 and 12 are cross-sectional views of a method of manufacturing the semiconductor device of FIG. 2. Detailed descriptions on processes and/or materials which are substantially the same as or similar to those described with reference to FIGS. 5 to 10 are omitted herein.

Referring to FIG. 11, a tunnel insulation layer 220 including a first silicon oxide layer 211, a silicon oxynitride layer 213, a silicon layer 215 and a second silicon oxide layer 217 sequentially stacked on a substrate 100 may be formed.

The first silicon oxide layer 211, the silicon layer 215 and the second silicon oxide layer 217 may be formed using processes and materials which are substantially the same as or similar to those described with reference to FIG. 5.

In some exemplary embodiments, a nitrogen containing flow may be introduced for a predetermined time before providing a first hydrogen flow for the formation of the silicon layer 215. In some exemplary embodiments, the nitrogen containing flow may include a mixture of ammonia ($NH_3$) and nitrous oxide ($N_2O$). In this case, a first silicon precursor adsorbed on the first silicon oxide layer 211 may be oxy-nitridated to form the silicon oxynitride layer 213. Subsequently, the first silicon precursor may be successively provided, and the first hydrogen flow may be provided to form the silicon layer 215 on the silicon oxynitride layer 213.

In exemplary embodiments, the silicon oxynitride layer 213 may be formed to be thinner than the silicon layer 215 so that a charge trap of the silicon oxynitride layer 213 may be avoided. For example, a supply time or a flow rate of the nitrogen containing flow may be smaller than that of the first hydrogen flow to control a thickness of the silicon oxynitride layer 213.

As described above, a second silicon precursor, an oxygen flow and a second hydrogen flow may be provided on the silicon layer 215 to form the second silicon oxide layer 217.

In some exemplary embodiments, a silicon oxynitride layer may be formed between the second silicon oxide layer 217 and the silicon layer 215. In this case, the nitrogen containing flow may be introduced to form the silicon oxynitride layer for a predetermined time before providing the oxygen flow and the second hydrogen flow.

Referring to FIG. 12, processes substantially the same as or similar to those illustrated with reference to FIGS. 6 to 7 may be performed.

For example, a floating gate layer, a dielectric layer, a control gate layer and a gate mask layer may be sequentially formed on the tunnel insulation layer 220. The gate mask layer, the control gate layer, the dielectric layer, the floating gate layer and the tunnel insulation layer 220 may be sequentially etched to form a gate structure including a gate pattern 170 and a tunnel insulation layer pattern 225.

The tunnel insulation layer pattern 225 may include a first silicon oxide layer pattern 212, a silicon oxynitride layer pattern 214, a silicon layer pattern 216 and a second silicon oxide layer pattern 218 sequentially stacked on the substrate 100. The gate pattern 170 may include a floating gate 135, a dielectric layer pattern 145, a control gate 155 and a gate mask 165 sequentially stacked on the tunnel insulation layer pattern 225.

Processes substantially the same as or similar to those described with reference to FIGS. 8 to 10 may be further performed to obtain the semiconductor device of FIG. 2.

FIGS. 13 to 18 are cross-sectional views showing a method of manufacturing a semiconductor device in accordance with exemplary embodiments of the present inventive concept.

For example, FIGS. 13 to 18 are cross-sectional views showing a method of manufacturing the semiconductor device of FIG. 3. Detailed descriptions on processes and/or materials which are substantially the same as or similar to those described with reference to FIGS. 5 to 10 are omitted herein.

Figure 13:
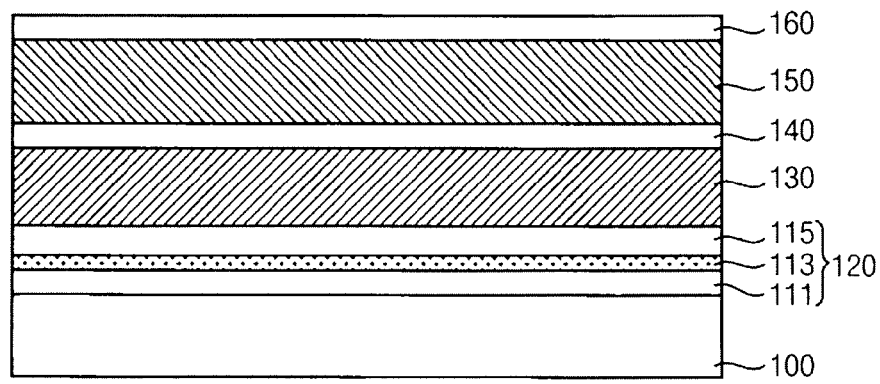
FIGS. 13 to 18 are cross-sectional views of a method of manufacturing a semiconductor device in accordance with exemplary embodiments of the present inventive concept.

Referring to FIG. 13, processes substantially the same as or similar to those described with reference to FIGS. 5 and 6 may be performed. In exemplary embodiments, a first silicon oxide layer 111, a silicon layer 113 and a second silicon oxide layer 115 may be sequentially formed on a substrate 100 to form a tunnel insulation layer 120. A floating gate layer 130, a dielectric layer 140, a control gate layer 150 and a gate mask layer 160 may be sequentially formed on the tunnel insulation layer 120.

Figure 14:
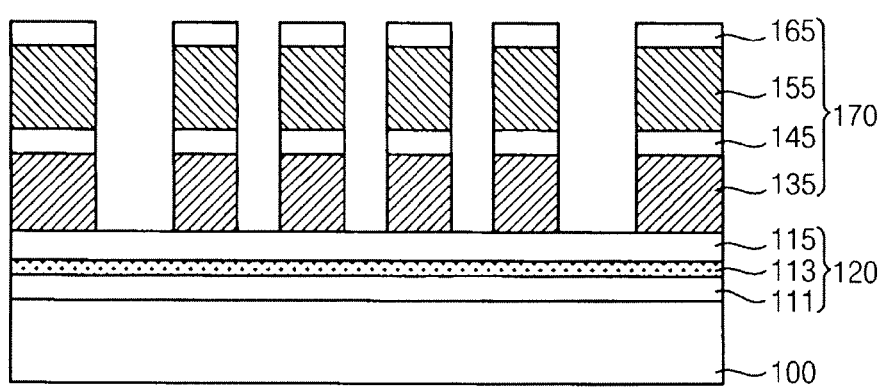

Referring to FIG. 14, the gate mask layer 160 may be partially etched to form a gate mask 165, and the control gate layer 150, the dielectric layer 40 and the floating gate layer 130 may be sequentially and partially etched using the gate mask 165 as an etching mask. Accordingly, a gate pattern 170 including a floating gate 135, a dielectric layer pattern 145, a control gate 155 and a gate mask 165 sequentially stacked on the tunnel insulation layer 120 may be formed.

Figure 15:
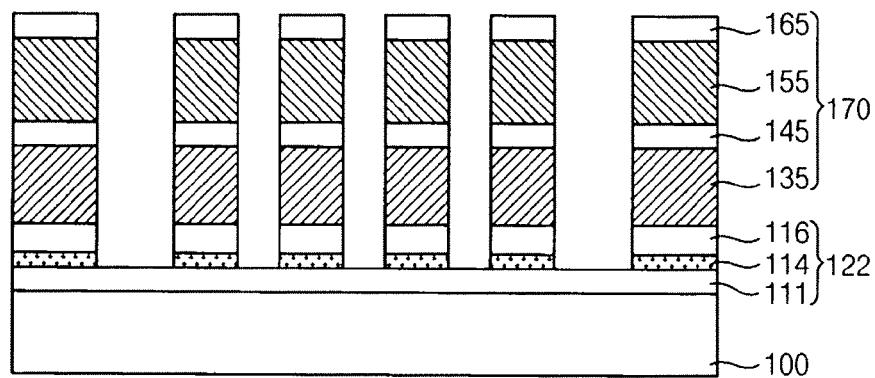

Referring to FIG. 15, a portion of the tunnel insulation layer 120 exposed between the gate patterns 170 neighboring in the first direction may be partially etched to form a tunnel insulation layer pattern 122.

In exemplary embodiments, the tunnel insulation layer 120 may be partially etch, while the tunnel insulation layer 120 of FIG. 7 may be completely etched between the neighboring gate patterns 170. Thus, the tunnel insulation layer pattern 122 may continuously extend in the first direction on the substrate 100. A portion of the tunnel insulation layer pattern 122 under the gate pattern 170 may have a thickness greater than that of a portion of the tunnel insulation layer pattern 122 between the neighboring gate patterns 170.

In some exemplary embodiments, the second silicon oxide layer 116 and the silicon layer 114 may be etched between the neighboring gate patterns 170 so that a second silicon oxide layer pattern 116 and a silicon layer pattern 114 substantially the same as those shown in FIG. 7 may be formed. However, the first silicon oxide layer 111 need not be substantially etched, and may be provided commonly for a plurality of the gate patterns 170. For example, the first silicon oxide layer 111 may remain continuous without being patterned.

The first silicon oxide layer 111 need not be completely etched between the neighboring gate patterns 170 so that an etching amount for foaming gate structures may be reduced. The gate structures having the tunnel insulation layer pattern 122 and the gate pattern 170 may have an operational property per each memory cell. Further, an etching damage of the substrate 100 serving as a channel may be prevented.

Figure 16:
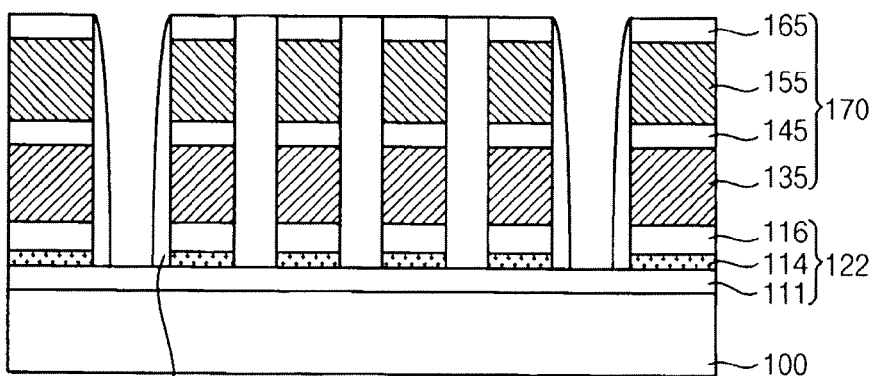

Referring to FIG. 16, a gate spacer 177 may be formed on sidewalls of the gate pattern 170, the second silicon oxide layer pattern 116 and the silicon layer pattern 114. For example, a spacer layer covering the gate patterns 170 may be formed on a top surface of the first silicon oxide layer 111, and the spacer layer may be anisotropically etched to form the gate spacer 177. The gate spacer 177 may partially cover the top surface of the first silicon oxide layer 111 exposed between the gate patterns 170 formed in a cell region and a peripheral circuit region.

Figure 17:
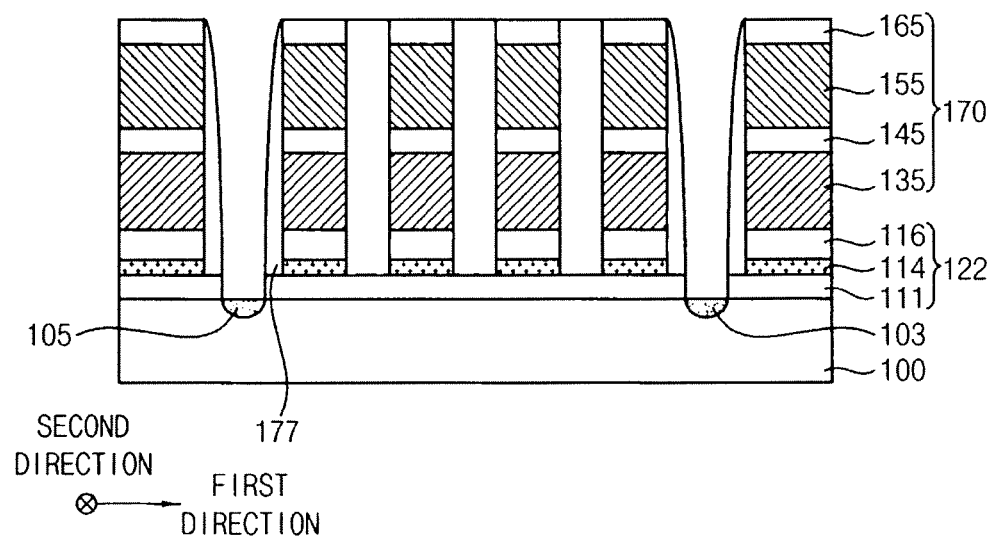

Referring to FIG. 17, the first silicon oxide layer 111 may be partially etched using the gate spacer 177 as an etching mask. Accordingly, a top surface of the substrate 100 may be partially exposed between the neighboring gate spacers 177.

Impurities may be implanted through the exposed top surface of the substrate 100 to form first and second impurity regions 103 and 105.

Figure 18:
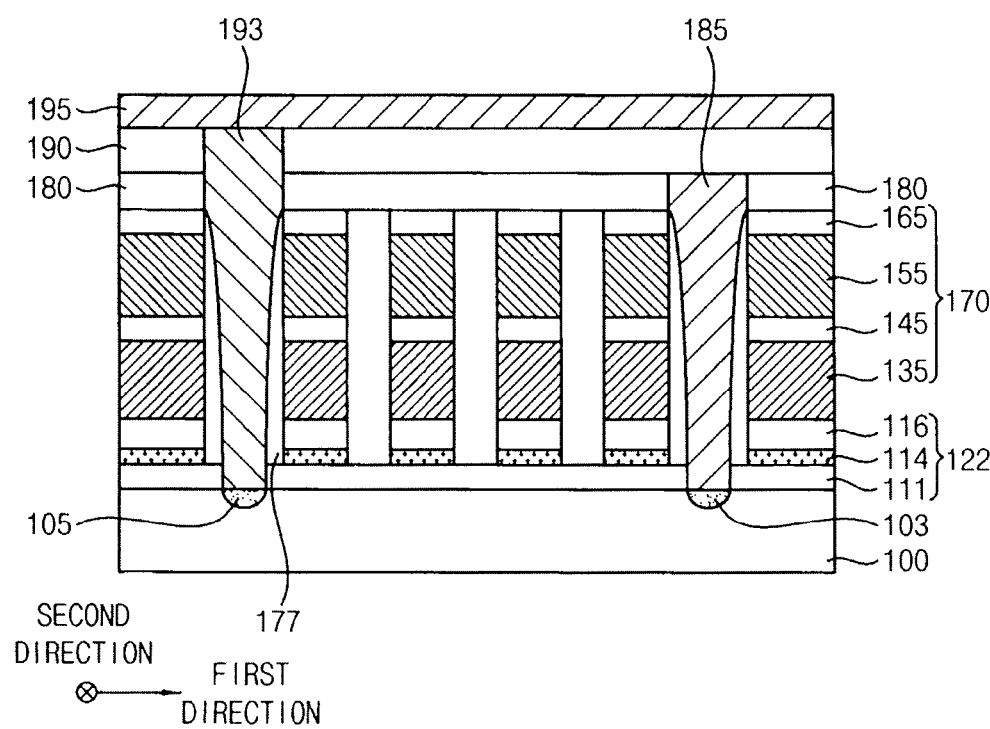

Referring to FIG. 18, processes substantially the same as or similar to those illustrated with reference to FIGS. 9 and 10 may be performed.

In exemplary embodiments, a first insulating interlayer 180 covering the impurity regions 103 and 105, the gate spacer 177 and the gate patterns 170 may be formed. A first plug 185 electrically connected to the first impurity region 103 may be formed through the first insulating interlayer 180.

A second insulating interlayer 190 may be formed on the first insulating interlayer 180 and the first plug 185. A second plug 193 electrically connected to the second impurity region 105 may be formed through the second and first insulating interlayers 190 and 180. A bit line 195 electrically connected to the second plug 193 may be formed on the second insulating interlayer 190.

Figure 19:
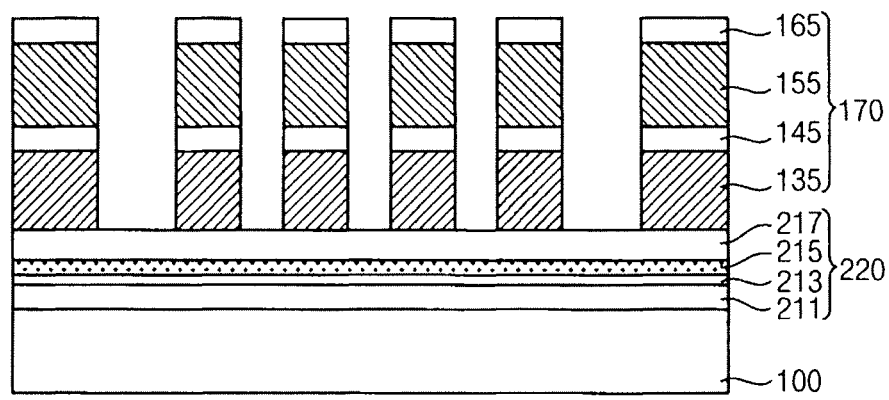
FIGS. 19 and 20 are cross-sectional views of a method of manufacturing a semiconductor device in accordance with exemplary embodiments of the present inventive concept.
Figure 20:
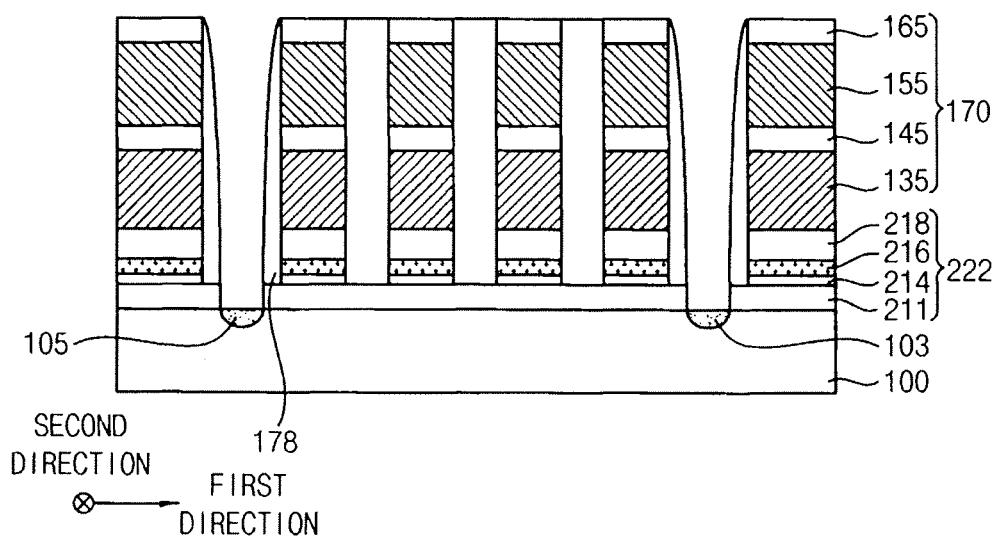

FIGS. 19 and 20 are cross-sectional views showing a method of manufacturing a semiconductor device in accordance with some exemplary embodiments of the present inventive concept.

For example, FIGS. 19 and 20 are cross-sectional views showing a method of manufacturing the semiconductor device of FIG. 4. Detailed descriptions on processes and/or materials which are substantially the same as or similar to those illustrated with reference to FIGS. 5 to 10, FIGS. 11 and 12, or FIGS. 13 to 18 are omitted herein.

Referring to FIG. 19, a process substantially the same as or similar to that illustrated with reference to FIG. 11 may be performed to form a tunnel insulation layer 220 including a first silicon oxide layer 211, a silicon oxynitride layer 213, a silicon layer 215 and a second silicon oxide layer 217 sequentially stacked on a substrate 100.

Subsequently, a process substantially the same as or similar to that described with reference to FIG. 14 may be performed to form gate patterns 170, each of which may include a floating gate 135, a dielectric layer pattern 145, a control gate 155 and a gate mask 165 sequentially stacked on the tunnel insulation layer 220.

Referring to FIG. 20, processes substantially the same as or similar to those described with reference to FIGS. 15 to 17 may be performed.

In exemplary embodiments, portions of the tunnel insulation layer 220 exposed between the gate patterns 170 neighboring in the first direction may be partially etched to form a tunnel insulation layer pattern 222.

In some exemplary embodiments, the second silicon oxide layer 217, the silicon layer 215, the silicon oxynitride layer 213 may be partially removed by the etching process to form a second silicon oxide layer pattern 218, a silicon layer pattern 216 and a silicon oxynitride layer pattern 214 which may be patterned per each gate pattern 170.

The first silicon oxide layer 211 need not be substantially etched to be provided commonly for a plurality of the gate patterns 170.

A gate spacer 178 may be formed on sidewalls of the gate pattern 170, the second silicon oxide layer pattern 218, the silicon layer pattern 216 and the silicon oxynitride layer pattern 214. A portion of the first silicon oxide layer 211 between the neighboring gate spacers 178 may be etched such that a top surface of the substrate 100 may be exposed. Impurities may be implanted through the exposed top surface of the substrate 100 to form first and second impurity regions 103 and 105.

Processes substantially the same as or similar to those described with reference to FIGS. 9 and 10 may be performed to obtain the semiconductor device of FIG. 4.

According to exemplary embodiments as described above, the first silicon oxide layer, the silicon layer and the second silicon oxide layer may be formed successively by an in-situ ALD process, for example. The silicon layer may be formed as a thin layer using the first silicon oxide layer as a seed layer and using a silicon precursor such as HCD. Thus, a valence band gap offset of a band-gap may be controlled without causing a charge trap or a charge loss so that an erase voltage may be decreased. Additionally, the silicon oxynitride layer may be formed between the silicon oxide layer and the silicon layer so that the valence band gap offset of the band-gap may be further decreased.

Figure 21:
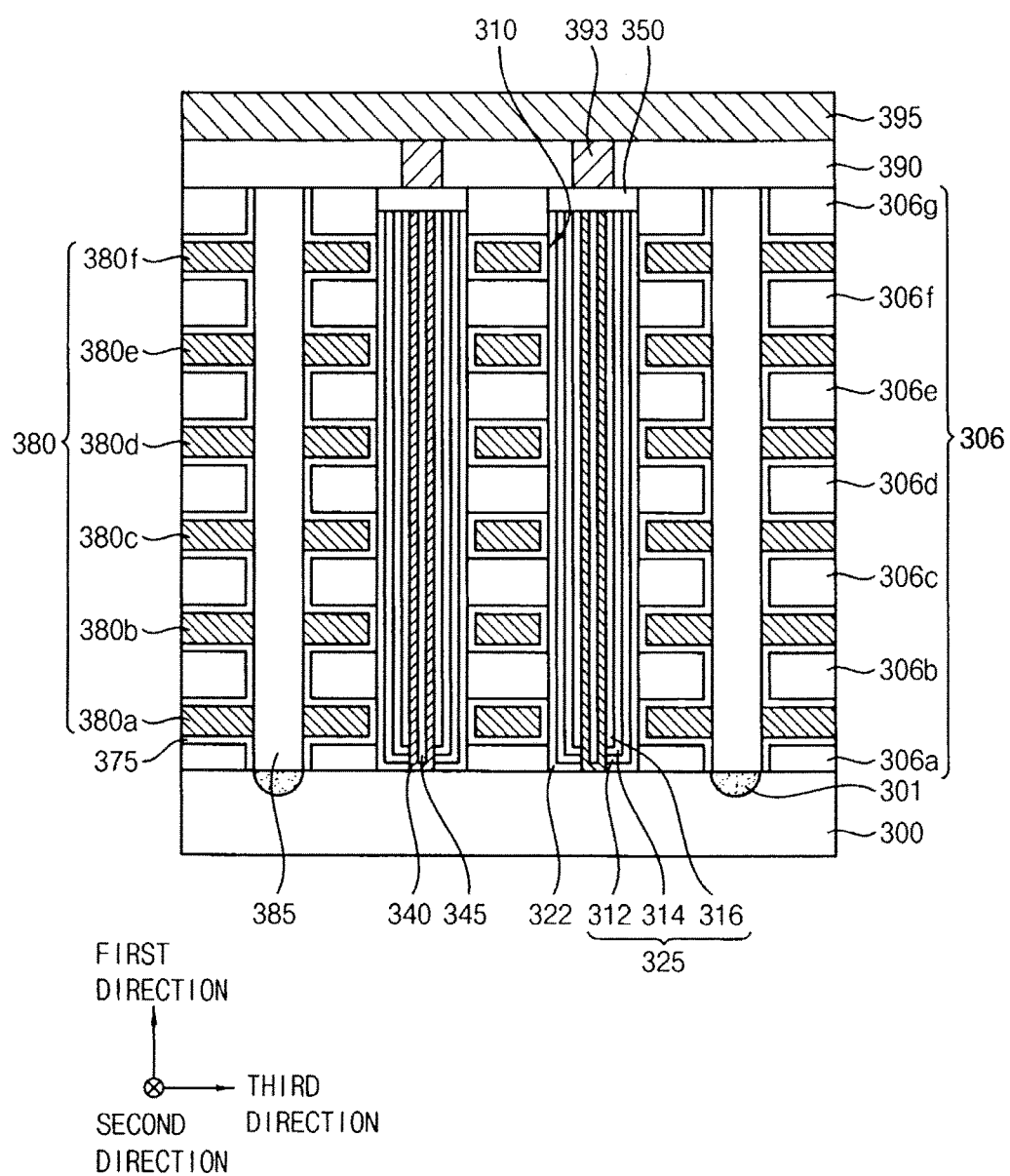
FIG. 21 is a cross-sectional view of a semiconductor device in accordance with exemplary embodiments of the present inventive concept.

FIG. 21 is a cross-sectional view showing a semiconductor device in accordance with exemplary embodiments. For example, FIG. 21 shows a vertical memory device including a channel vertically protruding from a substrate.

In FIG. 21, a direction substantially vertical to a top surface of the substrate is referred to as a first direction, and two directions substantially parallel to the top surface of the substrate and substantially crossing each other are referred to as a second direction and a third direction. For example, the second direction and the third direction are substantially perpendicular to each other. Additionally, a direction indicated by an arrow and a reverse direction thereof are considered as the same direction. The above mentioned definitions of the directions are the same throughout FIGS. 22 to 39.

Illustrations of dimensions of layers, structures, holes, openings, etc., may be different from those of actual structures, or may be modified for convenience of descriptions.

Referring to FIG. 21, the semiconductor device may include a channel 340 extending from a top surface of a substrate 100 in the first direction, a charge trap layer pattern 322 and a tunnel insulation layer pattern 325 surrounding an outer sidewall of the channel 340, a first filling layer pattern 345 in the channel 340, and insulating interlayer patterns 306 and gate lines 380 surrounding the charge trap layer pattern 322 and extending in the second direction.

The substrate 300 may include a semiconductor material silicon and/or germanium, for example. In an exemplary embodiment, the substrate 300 may serve as a p-type well of the vertical memory device.

The insulating interlayer patterns 306 (e.g., 306a to 306g) and the gate lines 380 (e.g., 380a to 380f) may be stacked alternately and repeatedly along the first direction from the top surface of the substrate 300. The insulating interlayer pattern 306 and the gate line 308 at each level may surround a plurality of channels 340, and may extend in the second direction.

The insulating interlayer pattern 306 may include silicon oxide-based material. The gate lines 380 neighboring in the first direction may be insulated from each other by the insulating interlayer pattern 306.

The gate line 380 may include metal or metal nitride. For example, the gate line 380 may include metal having a low electrical resistance and nitride thereof. In an exemplary embodiment, the gate line 380 may include tungsten, tungsten nitride, titanium, titanium nitride, tantalum, tantalum nitride, or platinum. In some exemplary embodiments, the gate line 380 may have a multi-layered structure including a barrier layer formed of a metal nitride and a metal layer.

For example, a lowermost gate line 380a may serve as a ground selection line (GSL). An uppermost gate line 380f may serve as a string selection lines (SSL). Gate lines 380b to 380e between the GSL and the SSL may serve as word lines.

In this case, the GSL, the word lines, and the SSL may be formed at a single level, 4 levels and a single level, respectively. However, the number of levels at which the GSL, the word line and the SSL are formed are not limited thereto. In some exemplary embodiments, the word lines may be formed using 8 levels or at least 16 levels (e.g., "2×n" levels, n is an integer equal to or more than 8). The stacked number of the gate lines 380 may be determined in consideration of a circuit design and a degree of integration of the vertical memory device.

A channel hole 310 may be formed, penetrating through the insulating interlayer patterns 306 and the gate lines 380. The charge trap layer pattern 322, the tunnel insulation layer pattern 325, the channel 340 and the first filling layer pattern 345 may be sequentially formed from a sidewall of the channel hole 310.

The channel 340 may be in contact with the top surface of the substrate 300, and have a cup shape. In an exemplary embodiment, the channel 340 may have a hollow cylindrical shape. The channel 340 may include polysilicon or single crystalline silicon, and at least a portion of the channel 340 may further include p-type impurities such as boron (B).

In exemplary embodiments, a plurality of the channels 340 may be arranged along the second direction to form a channel row. A plurality of the channel rows may be arranged along the third direction. The plurality of channels 340 may be individually separated from each other, and each channel 340 may extend in the first direction from the top surface of the substrate 300.

The first filling layer pattern 345 may fill an inner space of the channel 340, and may include an insulating material such as silicon oxide. The first filling layer pattern 345 may a pillar shape extending in the first direction.

A dielectric layer structure may include the charge trap layer pattern 322 and the tunnel insulation layer pattern 325. The dielectric layer structure may have a straw shape surrounding the outer sidewall of the channel 340.

The charge trap layer pattern 322 may include nitride such as silicon nitride, or high-k metal oxide. The charge trap layer pattern 322 may be formed on the sidewall of the channel 340, and may be also formed partially on the top surface of the substrate 300 exposed through the channel hole 310. In an exemplary embodiment, an end part of the charge trap layer pattern 322 may be in contact with the sidewall of the channel 340.

The tunnel insulation layer pattern 325 may be formed on the charge trap layer pattern 322. The tunnel insulation layer pattern 325 may include a first silicon oxide layer pattern 312, a silicon layer pattern 314 and a second silicon oxide layer pattern 316 sequentially stacked from an inner sidewall of the charge trap layer pattern 322. Accordingly, the tunnel insulation layer pattern 325 may have a substantially OSO-layered structure.

In exemplary embodiments, a thickness of the silicon layer pattern 314 may be smaller than a thickness of the first silicon oxide layer pattern 312 and a thickness of the second silicon oxide layer pattern 316. In some exemplary embodiments, the thickness of the first silicon oxide layer pattern 312 may be greater than the thickness of the second silicon oxide layer pattern 316.

For example, the thickness of the first silicon oxide layer pattern 312 may range from about 20 Å to about 30 Å. The thickness of the second silicon oxide layer pattern 316 may range from about 15 Å to about 25 Å. The thickness of the silicon layer pattern 314 may be less than about 20 Å. For example, the thickness of the silicon layer pattern 314 may range from about 10 Å to about 15 Å.

In some exemplary embodiments, a blocking layer pattern 375 may be formed along surfaces of each of the insulating interlayer patterns 306a to 306g, and an outer sidewall of the charge trap layer pattern 322. Accordingly, the gate line 380 at each level may be partially surrounded by the blocking layer pattern 375. The blocking layer pattern 375 may include silicon oxide or a high-k metal oxide, for example.

As described above, each channel hole 310 may be filled with the charge trap layer pattern 322, the tunnel insulation layer pattern 325, the channel 340 and the first filling layer pattern 345. In some exemplary embodiments, a pad 350 capping an upper portion of the channel hole 310 may be formed on the charge trap layer pattern 322, the tunnel insulation layer pattern 325, the channel 340 and the first filling layer pattern 345.

In some exemplary embodiments, a semiconductor pattern (not illustrated) filling a lower portion of the channel hole may be further formed on the substrate 300. In this case, the charge trap layer pattern 322 and the channel 340 may be in contact with the semiconductor pattern. For example, the lowermost gate line 380a serving as the GSL may surround a lateral portion of the semiconductor pattern. The semiconductor pattern may include single crystalline silicon or polysilicon, for example.

The second filling layer pattern 385 may extend in the second direction, and may have a fence shape intersecting the gate lines 380 and the insulating interlayer patterns 306 in the first direction. A plurality of the second filling layer patterns 385 may be arranged in the third direction. The predetermined number of the channel rows, and the gate lines 380 surrounding the channel rows may be included between the neighboring second filling layer patterns 385 to form a gate line structure. In some exemplary embodiments, four of the channel rows may be included in one gate line structure. The present inventive concept is not limited thereto, and the gate line structure may include two or more channel rows.

An impurity region 301 may be formed in an upper portion of the substrate 300 under the second filling layer pattern 385. For example, the impurity region 301 may extend in the second direction, and may serve as a CSL of the vertical memory device.

An upper insulation layer 390 may be formed on an uppermost insulating interlayer pattern 306g, the pad 350 and the second filling layer pattern 385. The upper insulation layer 390 and the second filling layer pattern 385 may include an insulating material such as silicon oxide.

A bit line contact 393 may penetrate through the upper insulation layer 390, and may be in contact with or electrically connected to the pad 350. A bit line 395 may be disposed on the upper insulation layer 390 to be electrically connected to a plurality of bit line contacts 393. The bit line 395 may extend in, e.g., the third direction.

According to exemplary embodiments as described above, a tunnel insulation layer included in a charge trap-type vertical memory device may include an OSO-layered structure. A silicon layer may be interposed between oxide layers so that a valence band offset between the silicon layer and the oxide layer may be decreased to reduce an erase voltage while minimizing a charge loss or a charge trap in the tunnel insulation layer. Thus, an erase voltage required for an erase operation in a cell string formed along one channel 340 may be reduced. Therefore, operational and structural reliability of the vertical memory device in which a plurality of memory cells are 3-dimensionally stacked may increase.

FIGS. 22 to 37 are cross-sectional views and top plan views of a method of manufacturing a semiconductor device in accordance with exemplary embodiments of the present inventive concept. For example, FIGS. 22 to 37 illustrate a method of manufacturing the vertical memory device of FIG. 21.

Figure 24:
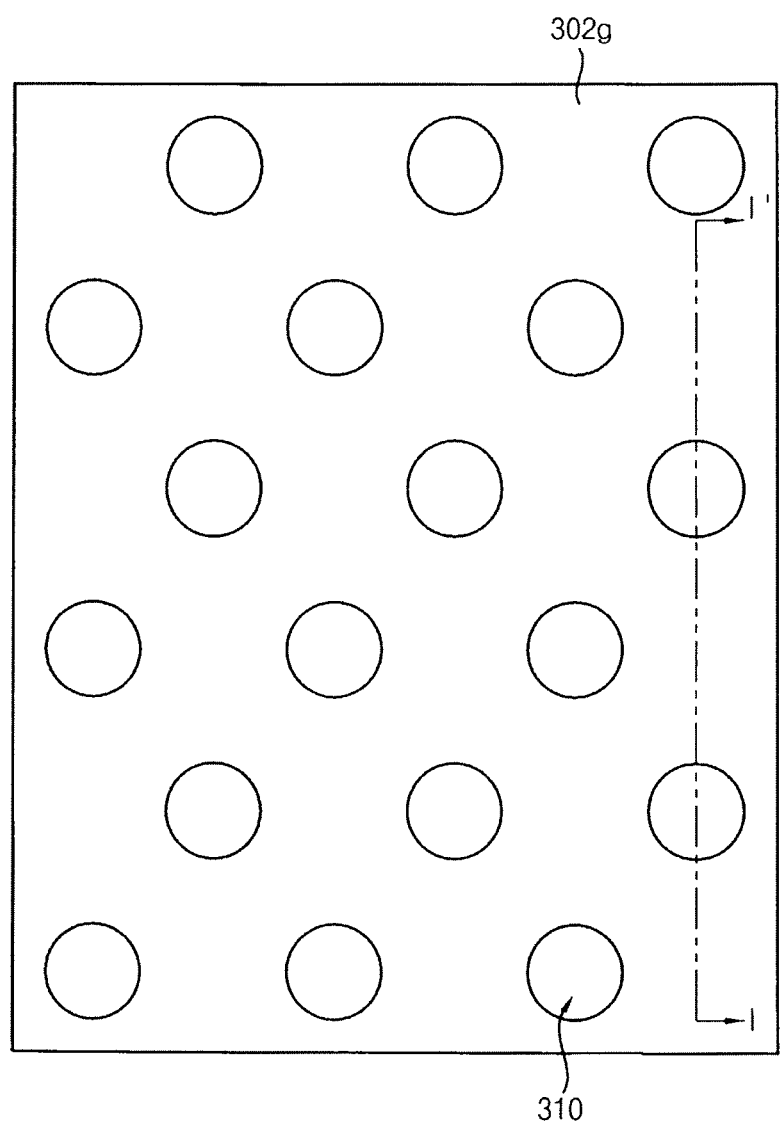

FIGS. 24 and 32 are top plan views showing the method. FIGS. 22, 23, 25 to 31, and 33 to 37 are cross-sectional views taken along line I-I' indicated in FIGS. 24 and 32.

Referring to FIG. 22, insulating interlayers 302 (e.g., 302a to 302g) and sacrificial layers 304 (e.g., 304a to 3040) may be alternately and repeatedly formed on a substrate 300 to form a mold structure.

In exemplary embodiments, the insulating interlayer 302 may be formed using an oxide-based material, e.g., silicon dioxide, silicon carbooxide and/or silicon fluorooxide. The sacrificial layer 304 may be formed using a material that may have etching selectivity with respect to the insulating interlayer 302 and may be removed by a wet etching process. For example, the sacrificial layer 304 may be formed using a nitride-based material, e.g., silicon nitride and/or silicon boronitride.

The insulating interlayer 302 and the sacrificial layer 304 may be formed by a CVD process, a PECVD process, a spin coating process, etc. A lowermost insulating interlayer 302a may be formed by a thermal oxidation process on the top surface of the substrate 300. In this case, the lowermost insulating interlayer 302a may thinner than other insulating interlayers 302b through 302g.

The sacrificial layers 304 may be removed in a subsequent process to provide spaces for a GSL, a word line and an SSL. Thus, the number of the insulating interlayers 302 and the sacrificial layers 304 may be adjusted in consideration of the number of the GSL, the word line and the SSL. For example, as illustrated with reference to FIG. 21, each of the GSL and the SSL may be formed at a single level, and the word line may be formed at 4 levels. Accordingly, the sacrificial layers 304 may be formed at 6 levels, and the insulating interlayers 302 may be formed at 7 levels as illustrated in FIG. 22. However, the numbers of the GSL, the SSL and the word line are not limited to the examples provided herein, and may be adjusted in consideration of a degree of integration and a circuit design of the semiconductor device.

Referring to FIGS. 23 and 24, a plurality of channel holes 310 may be formed through the mold structure.

In exemplary embodiments, a hard mask (not illustrated) may be formed on an uppermost insulating interlayer 302g. The insulating interlayers 302 and the sacrificial layers 304 may be partially etched by a dry etching process, for example. The hard mask may be used as an etching mask to form the channel hole 310. A top surface of the substrate 300 may be partially exposed by the channel hole 310.

The hard mask may be formed of silicon-based or carbon-based spin-on hardmask (SOH) materials, and/or a photoresist material. After the formation of the channel hole 310, the hard mask may be removed by an ashing process and/or strip process.

As illustrated in FIG. 24, a plurality of the channel holes 310 may be formed in the second direction to form a channel hole row. A plurality of the channel hole rows may be formed in the third direction. The channel holes 310 included in the neighboring channel hole rows may face each other in a zigzag arrangement.

Figure 25:
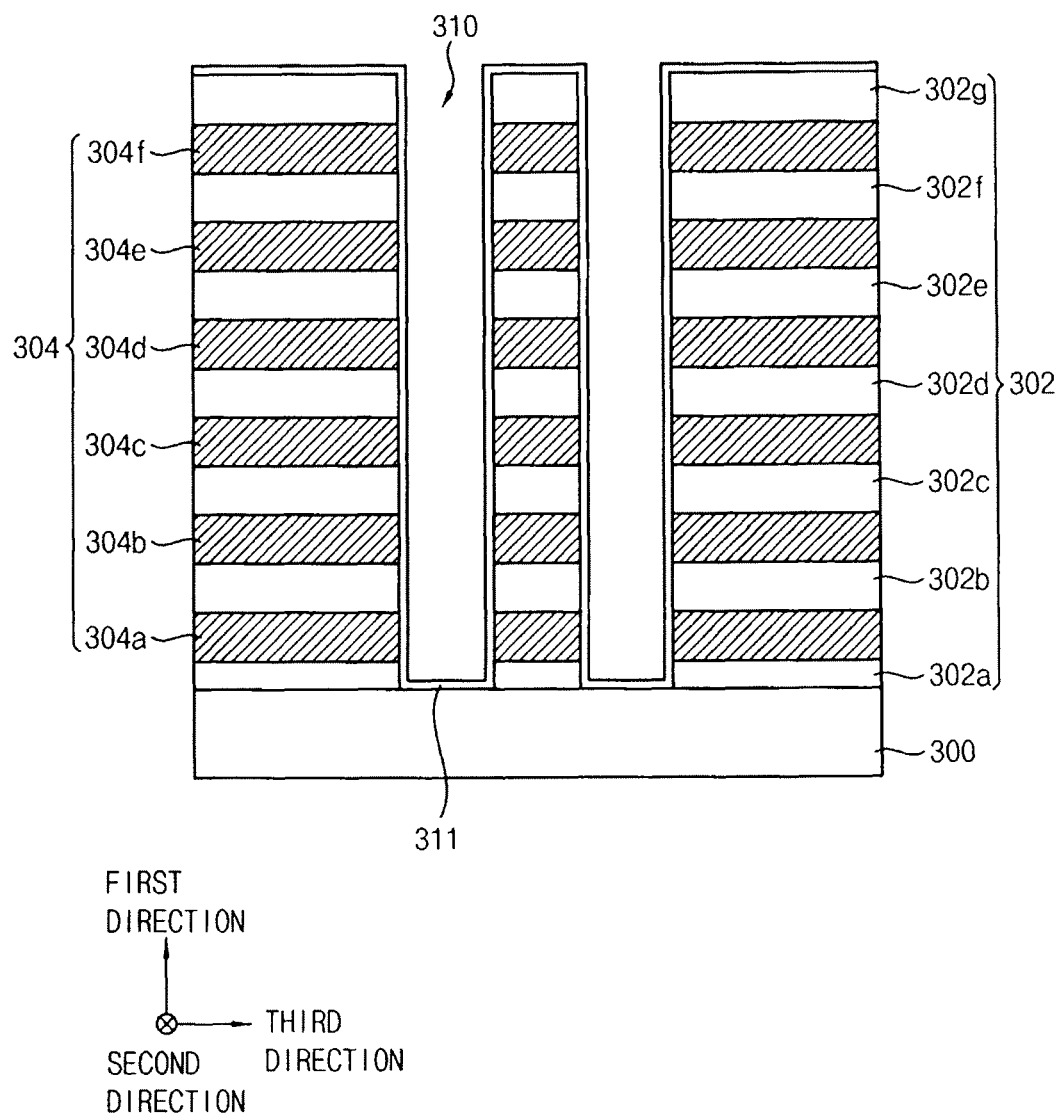

Referring to FIG. 25, a charge trap layer 311 may be formed conformally on an uppermost insulating interlayer 302g, and sidewalls and bottoms of the channel holes 310.

For example, the charge trap layer 311 may be formed of silicon nitride by an ALD process.

Figure 26:
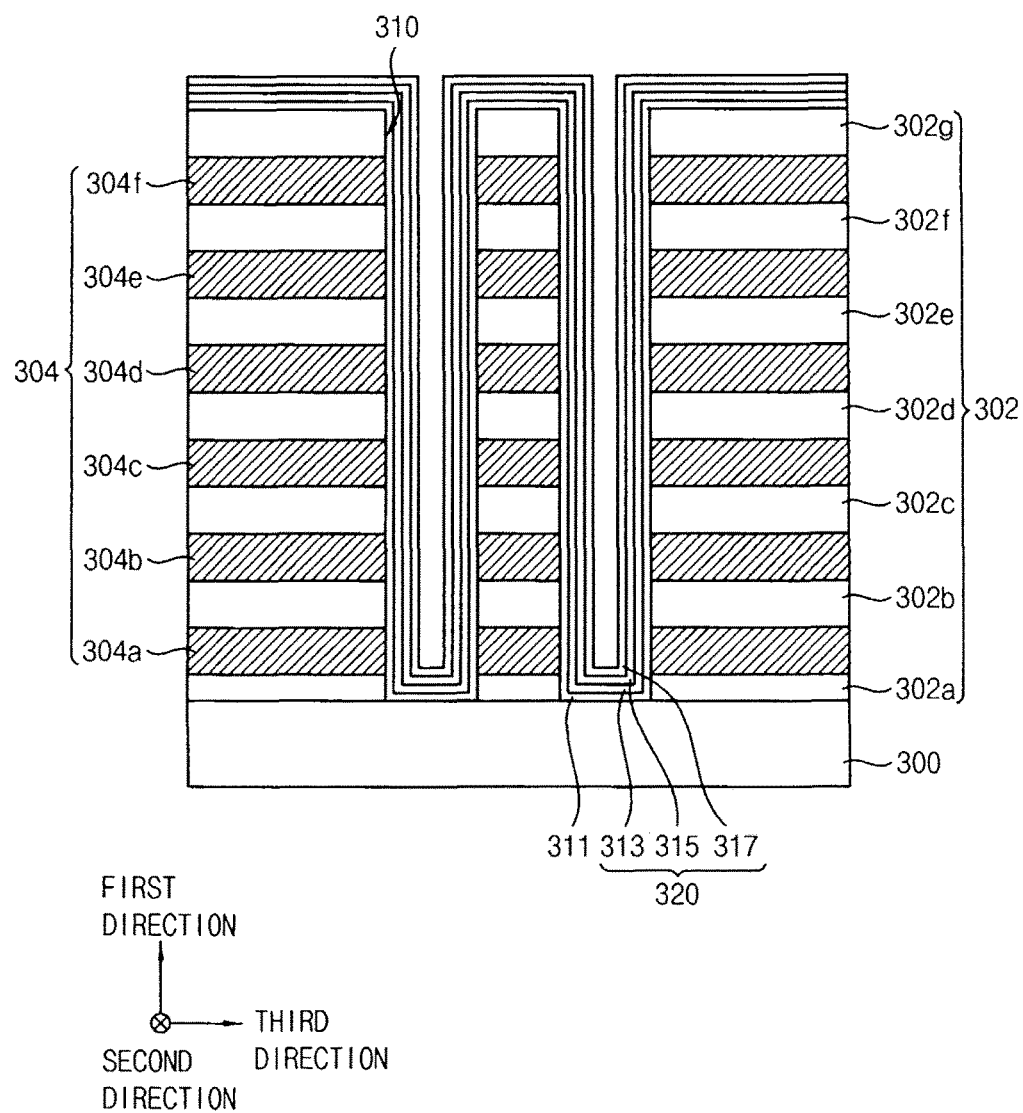

Referring to FIG. 26, a tunnel insulation layer 320 may be formed on the charge trap layer 311.

In exemplary embodiments, a first silicon oxide layer 313, a silicon layer 315 and a second silicon oxide layer 317 may be sequentially formed on the charge trap layer 311 to form the tunnel insulation layer 320 having an OSO-layered structure.

The first silicon oxide layer 313, the silicon layer 315 and the second silicon oxide layer 317 may be formed by a process substantially the same as or similar to that described with reference to FIG. 5.

In some exemplary embodiments, the first silicon oxide layer 313, the silicon layer 315 and the second silicon oxide layer 317 may be formed by an in-situ ALD process.

The first silicon oxide layer 313 including silicon oxide and having a thickness ranging from about 20 Å to about 30 Å may be formed on the charge trap layer 311 by an ALD process. A first silicon precursor such as HCD and a first hydrogen flow may be introduced in an ALD process chamber, and the silicon layer 315 may be grown from the first silicon oxide layer 313 that may serve as a seed layer or an adsorption layer. The silicon layer 315 may be formed by a chemisorption mechanism, and the formation of the silicon layer 315 may be self-limiting to have a thickness of a substantially atomic layer. Further, pressures and/or flow rates of the first silicon precursor and the first hydrogen flow may be adjusted so that a growth rate of the silicon layer 315 may be controlled.

In some exemplary embodiments, the silicon layer 315 may have a thickness less than about 20 Å. For example, the silicon layer 315 may have a thickness ranging from about 10 Å to about 15 Å.

A second silicon precursor such as HCD, an oxygen flow and a second hydrogen flow may be introduced on the silicon layer 315 to form the second silicon oxide layer 317.

The second silicon oxide layer 317 may be formed under a condition where oxidation of the silicon layer 315 may be prevented. For example, a supply time of the second silicon precursor may be controlled to be greater than a supply time of a combination of the oxygen flow and the second hydrogen flow. In some exemplary embodiments, the supply time of the second silicon precursor may be at least twice the supply time of the combination of the oxygen flow and the second hydrogen flow.

For example, the supply time of the second silicon precursor may be at least 20 seconds, and the supply time of the combination of the oxygen flow and the second hydrogen flow may be less than about 10 seconds. Further, a flow rate of the second hydrogen flow may be controlled to be less than about 200 standard cubic centimeters per minute (sccm). For example, the flow rate of the second hydrogen flow may range from about 100 sccm to about 200 sccm for preventing the oxidation of the silicon layer 315.

In some exemplary embodiments, a thickness of the second silicon oxide layer 317 may be greater than that of the silicon layer 315, and may be smaller than that of the first silicon oxide layer 313 by controlling the supply time and a flow rate of the second silicon precursor. In exemplary embodiments, the thickness of the second silicon oxide layer 317 may range from about 15 Å to about 25 Å.

Figure 27:
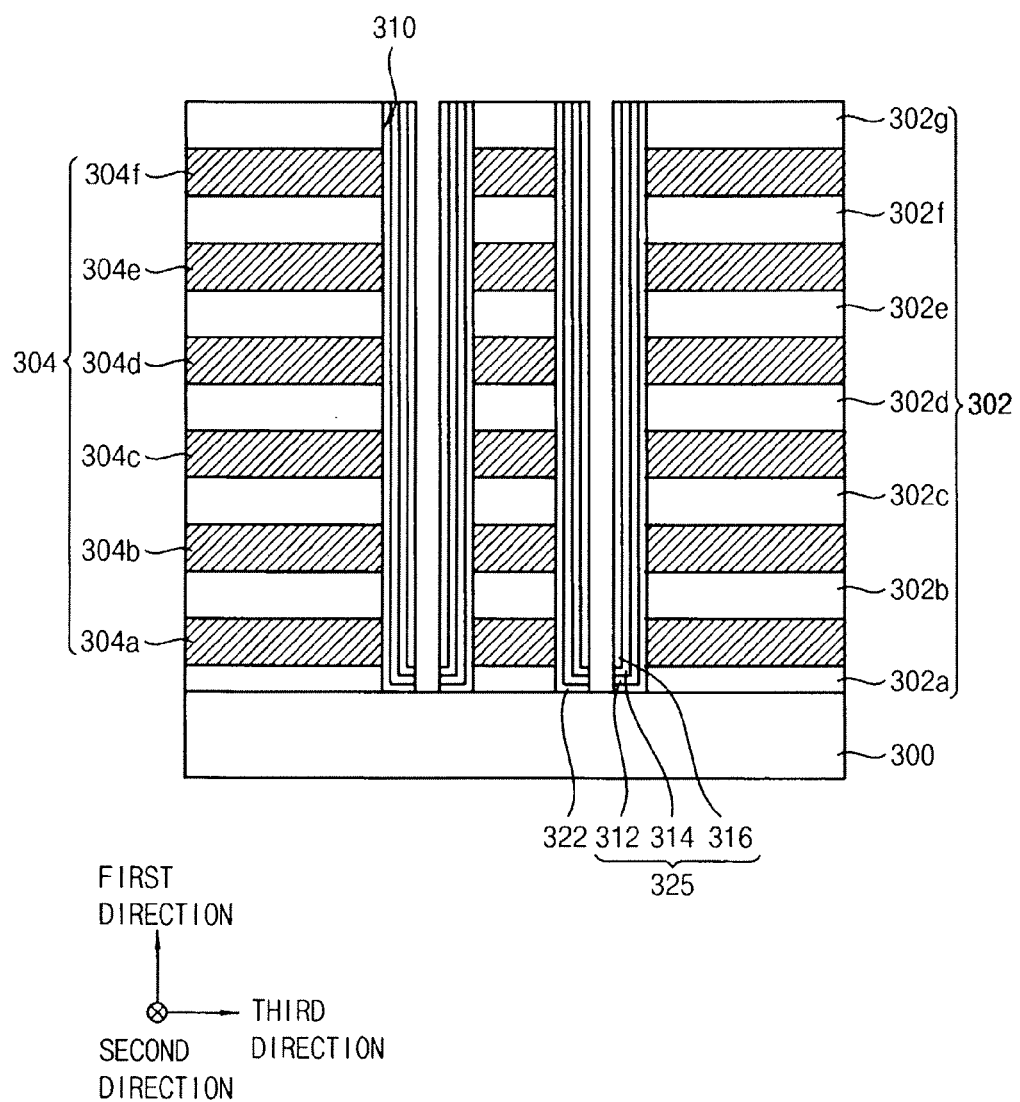
Figure 28:
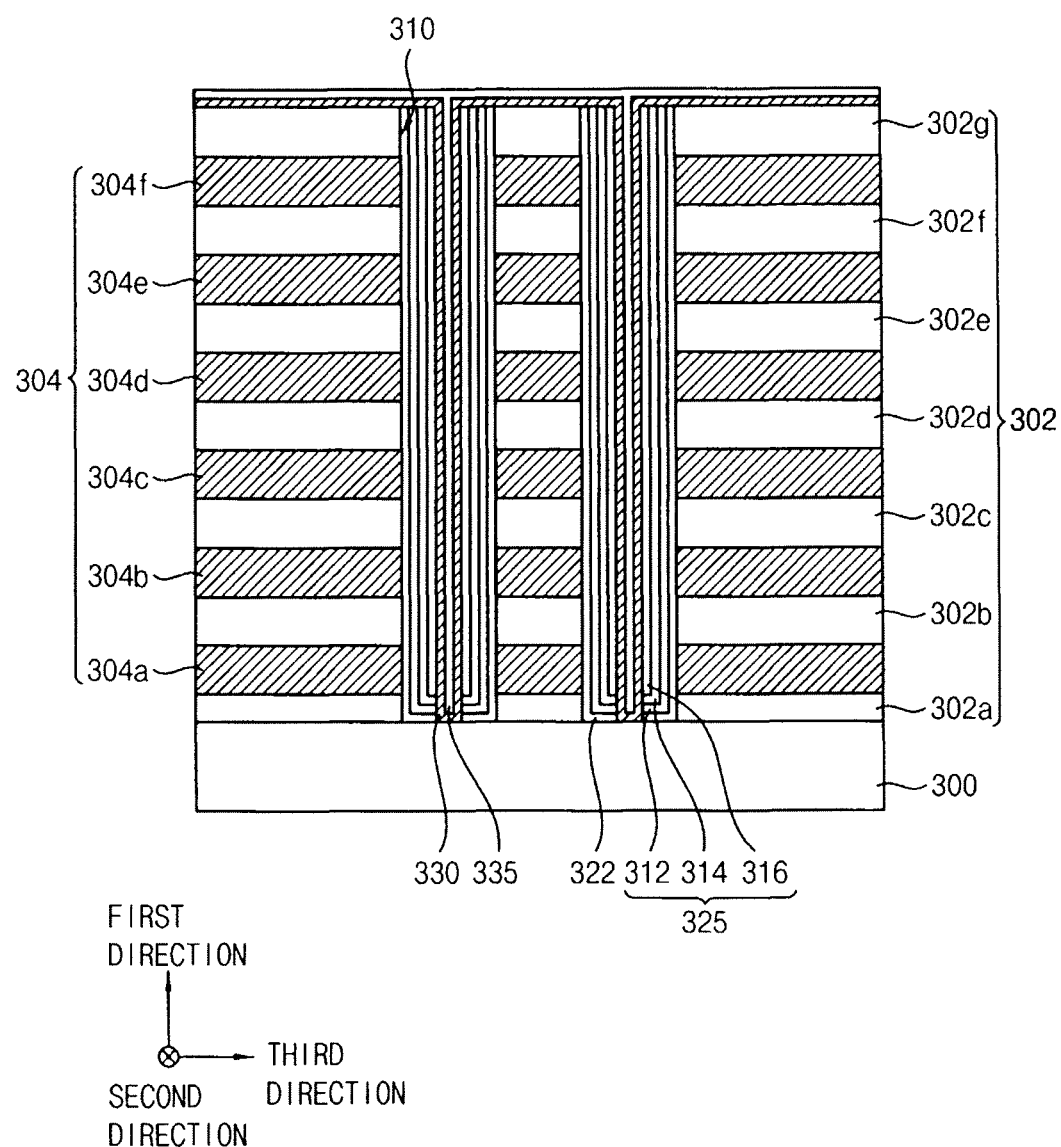

Referring to FIG. 27, portions of the charge trap layer 311 and the tunnel insulation layer 320 formed on the bottom of the channel hole 310 may be partially removed by an etch-back process. First portions of the charge-trap layer 311 and the tunnel insulation layer 320 formed on the uppermost insulating interlayer 302g may be removed by the etch-back process. Second portions of the charge-trap layer 311 and the tunnel insulation layer 320 formed on the substrate 300 may be removed in the etch-back process. The first portions and the second portions may be removed at substantially the same time in the etch-back process.

After the etch-back process, the top surface of the substrate 300 may be exposed through the channel hole 310, and a dielectric layer structure including a charge trap layer pattern 322 and a tunnel insulation layer pattern 325 may be formed on the sidewall of the channel hole 310. The dielectric layer structure may have a straw shape partially filling the channel hole 310.

The tunnel insulation layer pattern 325 may include a first silicon oxide layer pattern 312, a silicon layer pattern 314 and a second silicon oxide layer pattern 316 sequentially stacked from the charge trap layer pattern 322 to form an OSO-layered structure.

As described above, the thickness of each layer included in the OSO-layered structure may be controlled in the in-situ ALD process so that an operational property of the semiconductor device may increase. For example, the silicon layer pattern 314 formed as an intermediate layer of the OSO-layered structure may have a silicon layer having the smallest thickness so that a valence band offset of a band-gap may decrease and less charges may be trapped in the silicon layer pattern 314 compared to an intermediate layer which would be formed of a material trapping electrons therein, for example, nitride. The first and second silicon oxide layer patterns 312 and 316 may be substantially charge trap-free and may have thicknesses greater than the silicon layer patter 314. Such combination of material and thickness between the silicon layer pattern 314 and the silicon oxide layer patterns 312 and 316 may increase reliability of the semiconductor device.

For example, the first silicon oxide layer pattern 312 may have the greatest thickness in the OSO-layered structure to serve as a charge barrier. For example, discharge or diffusion of an electron stored in the charge trap layer pattern 322 may be blocked by the first silicon oxide layer pattern 312. The second silicon oxide layer pattern 316 may serve as a barrier for preventing the silicon layer pattern 314 from being damaged by native oxidation, a subsequent thermal process, etc, for example. The thickness of the first silicon oxide layer 312 and/or the second silicon oxide layer pattern 316 may be properly adjusted so that the silicon layer 315 may be prevented from being concurrently oxidized Referring to FIG. 28, a channel layer 330 may be formed on the uppermost insulating interlayer 302g, the charge trap layer pattern 322 and the tunnel insulation layer pattern 325, and then a first filling layer 335 may be formed on the channel layer 330 to completely fill a remaining portion of the channel hole 310.

The channel layer 330 may be formed using polysilicon or amorphous silicon which is optionally doped with impurities. In exemplary embodiments, a heat treatment or a laser beam irradiation may be further performed on the channel layer 330. In this case, the channel layer 330 may include single crystalline silicon. The first filling layer 335 may be formed using an insulating material, e.g., silicon oxide or silicon nitride.

The channel layer 330 and the first filling layer 335 may be formed by a CVD process, a PECVD process, an ALD process, a PVD process, etc.

Figure 29:
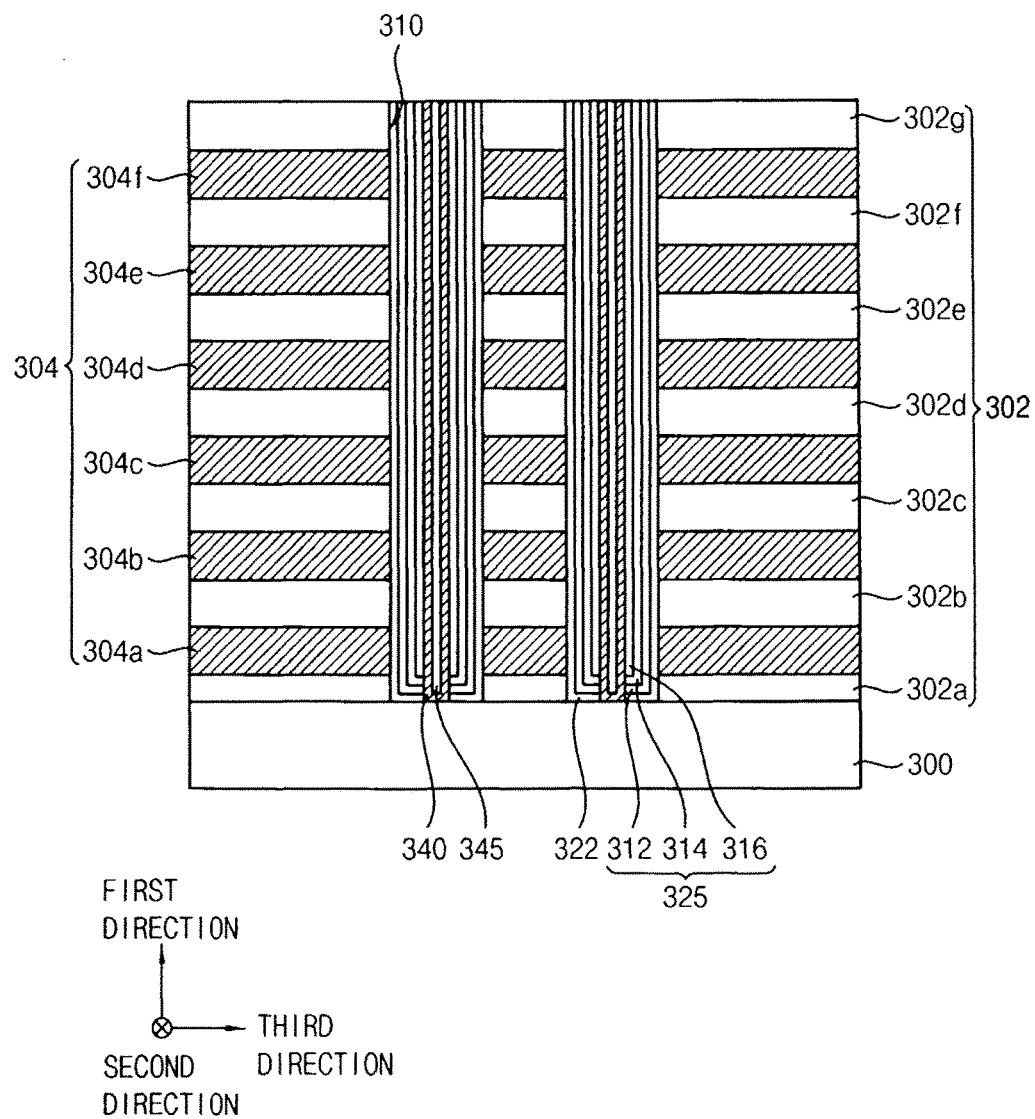

Referring to FIG. 29, upper portions of the first filling layer 335 and the channel layer 330 may be planarized by, e.g., a CMP process until the uppermost insulating interlayer 302g is exposed. Accordingly, a channel 340 and a first filling layer pattern 345 filling the channel hole 310 may be formed.

The channel 340 may have a cup shape, for example, and the first filling layer pattern 345 may have a pillar shape accommodated in the channel 340.

The channel 340 may be formed in each of the channel holes 310 such that a plurality of the channels 340 may be arranged to be physically spaced apart from each other on the substrate 300. A channel row may be formed along the channel hole row, and thus a plurality of the channel rows may be arranged along the third direction.

In some exemplary embodiments, after the formation of the channel hole 310 as illustrated in FIGS. 23 and 24, a semiconductor pattern may be further formed at a lower portion of the channel hole 310 before forming the charge trap layer 311 as illustrated in FIG. 25. The semiconductor pattern may be formed by a selective epitaxial growth (SEG) process using the top surface of the substrate 300 as a seed. In this case, the semiconductor pattern may fill the lower portion of the channel hole 310, and the charge trap layer pattern 322, the tunnel insulation layer pattern 325 and the channel 340 may be formed on a top surface of the semiconductor pattern.

Figure 30:
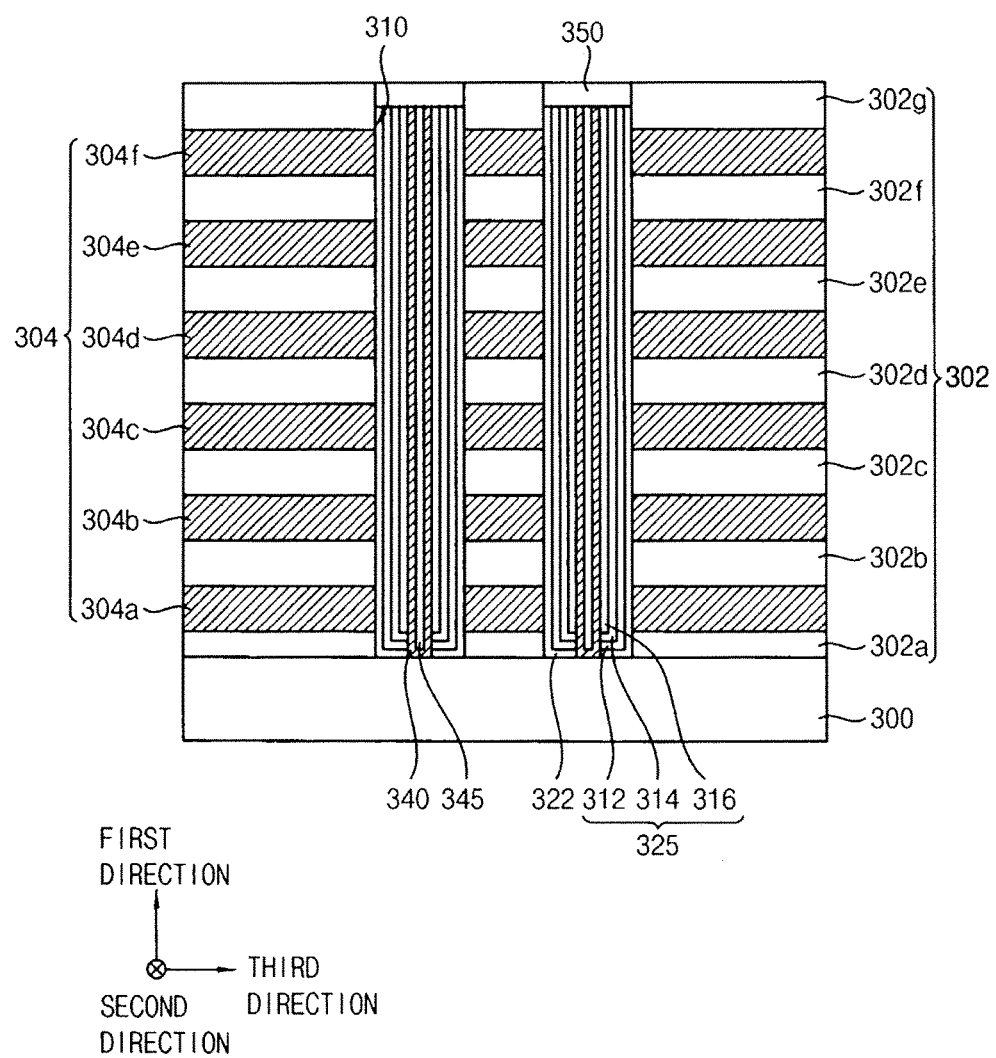

Referring to FIG. 30, a pad 350 filling an upper portion of the channel hole 310 may be formed.

For example, upper portions of the charge trap layer pattern 322, the tunnel insulation layer pattern 325, the channel 340 and the first filling layer pattern 345 may be partially removed by an etch-back process to form a recess, for example. A pad layer may be formed on the uppermost insulating interlayer 302g to completely fill the recess. An upper portion of the pad layer may be planarized until a top surface of the uppermost insulating interlayer 302g is exposed to form the pad 350 from a remaining portion of the pad layer. In exemplary embodiments, the pad layer may be formed using polysilicon optionally doped with n-type impurities. In exemplary embodiments, a preliminary pad layer including amorphous silicon may be formed, and then a crystallization process may be performed thereon to form the pad layer.

Figure 31:
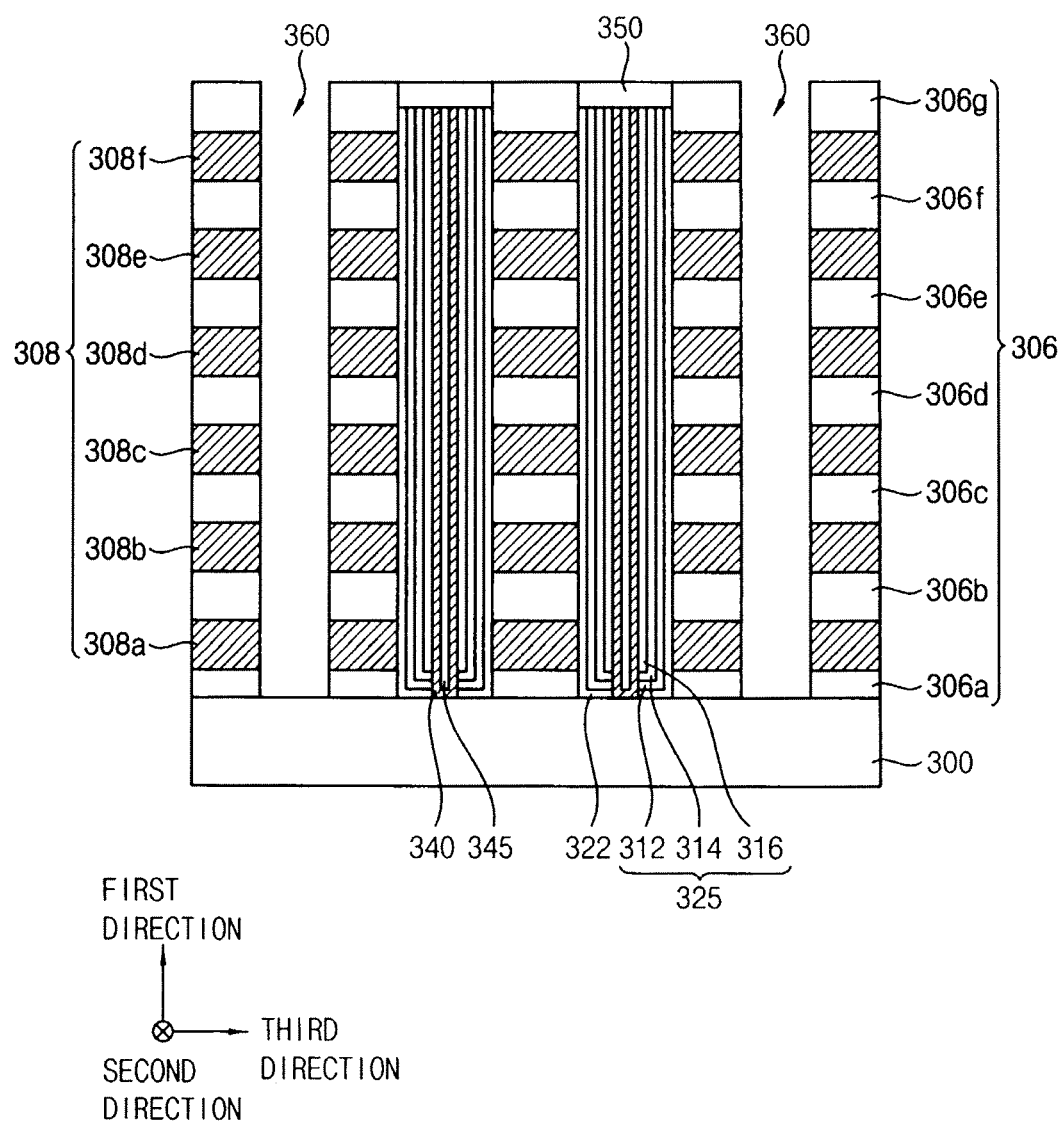

Referring to FIGS. 31 and 32, the insulating interlayers 302 and the sacrificial layers 304 may be partially etched to form openings 360.

In exemplary embodiments, a hard mask (not illustrated) covering the pads 350 and partially exposing the uppermost insulating interlayer 302g between some of the channel rows may be formed. The insulating interlayers 302 and the sacrificial layers 304 may be partially etched by a dry etching process using the hard mask as an etching mask to form the opening 360. The hard mask may be formed using a photoresist material or an SOH material. The hard mask may be removed by an ashing process and/or a strip process after the formation of the opening 360.

The opening 360 may extend in the second direction, and a plurality of the openings 360 may be formed along the third direction by a predetermined distance. For example, four channel rows may be included between the openings 360 neighboring in the third direction.

After the formation of the opening 360, the insulating interlayers 302 and the sacrificial layers 304 may be changed into insulating interlayer patterns 306 (e.g., 306a to 306g) and sacrificial layer patterns 308 (e.g., 308a through 308f). The insulating interlayer pattern 306 and the sacrificial layer pattern 308 at each level may be intersected by the opening 360, and may extend in the second direction. The top surface of the substrate 300, and sidewalls of the insulating interlayer patterns 306 and the sacrificial layer patterns 308 may be exposed through the opening 360.

Figure 33:
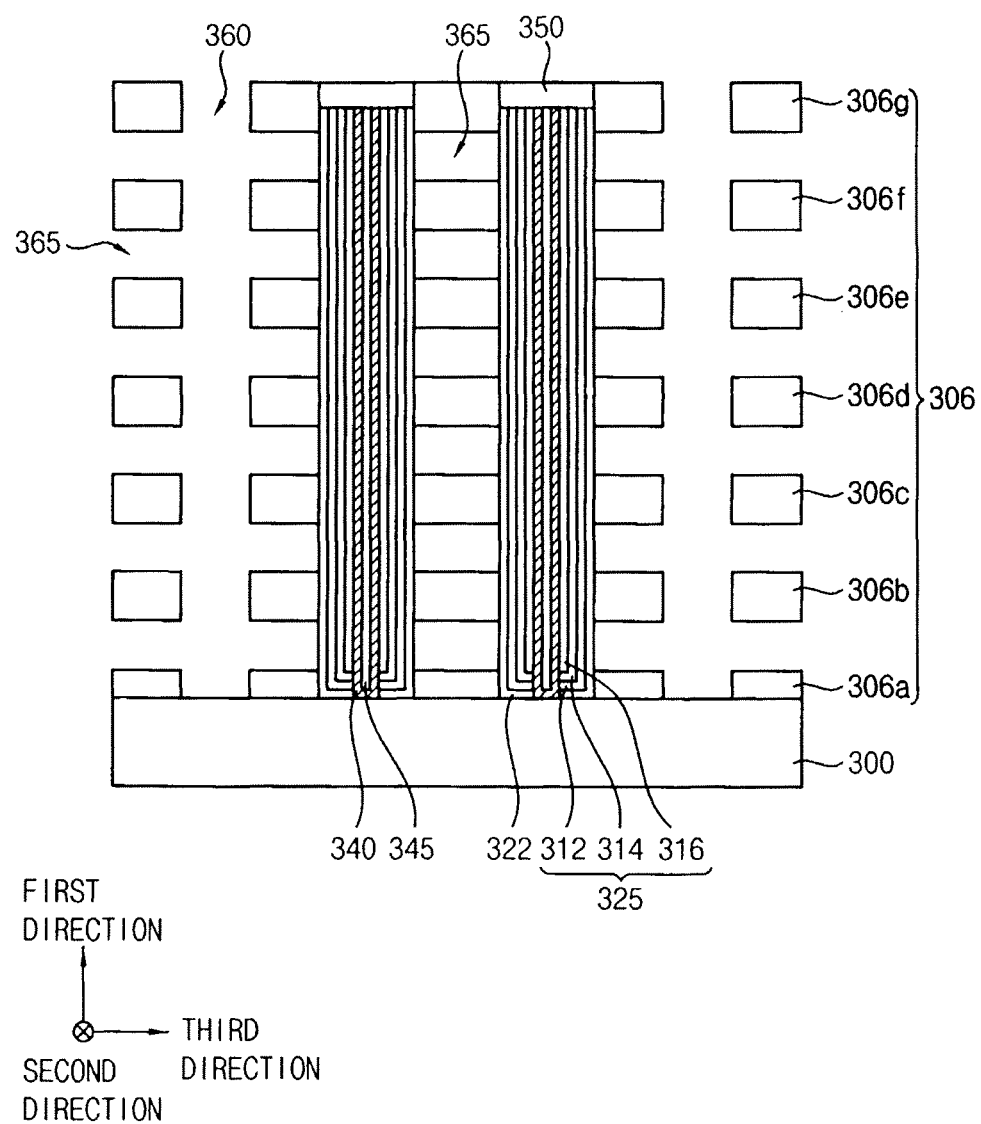

Referring to FIG. 33, the sacrificial layer patterns 308, the sidewalls of which are exposed by the opening 360 may be removed. In exemplary embodiments, the sacrificial layer patterns 308 may be removed by a wet etching process using, e.g., phosphoric acid and/or sulfuric acid that may have etching selectivity for silicon nitride as an etchant solution.

A gap 365 may be formed as a space from which the sacrificial layer pattern 308 is removed. A plurality of the gaps 365 may be formed along the first direction. An outer sidewall of the charge trap layer pattern 322 may be at least partially exposed by the gap 365.

Figure 34:
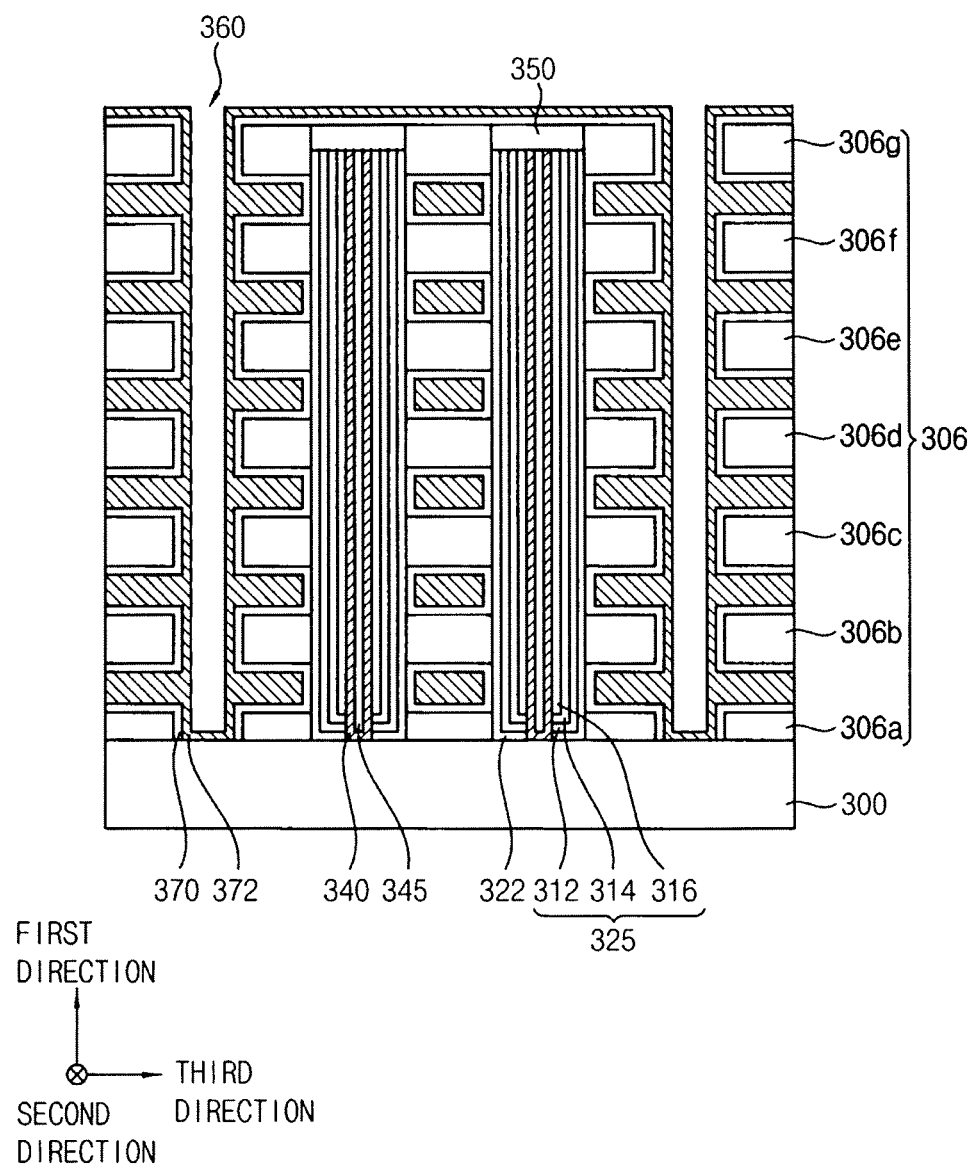

Referring to FIG. 34, a blocking layer 370 may be formed conformally on surfaces of the insulating interlayer patterns 306, and top surfaces of the pads 350. A gate electrode layer 372 filling the gaps 365 and partially filling the opening 360 may be formed on the blocking layer 370.

The blocking layer 370 may be formed of silicon oxide or a high-k metal oxide. The gate electrode layer 372 may be formed using metal or metal nitride having low electrical resistance and work function. For example, the gate electrode layer 372 may be formed using tungsten, tungsten nitride, titanium, titanium nitride, tantalum, tantalum nitride, platinum, etc. In exemplary embodiments, the gate electrode layer 372 may be formed as a multi-layered structure including a barrier layer formed of a metal nitride and a metal layer. The blocking layer 370 and the gate electrode layer 372 may be formed by a CVD process, a PECVD process, an ALD process, a PVD process, a sputtering process, etc.

Figure 35:
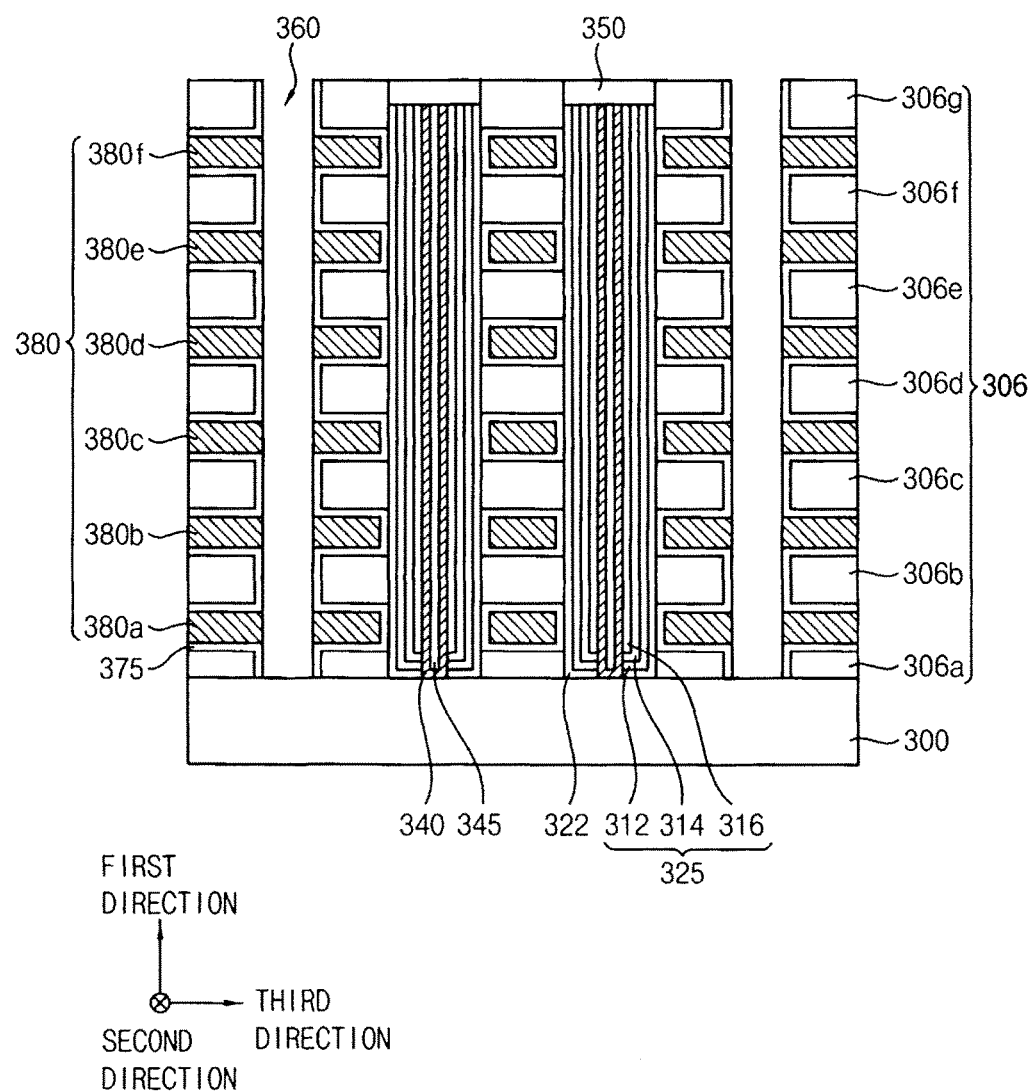

Referring to FIG. 35, the blocking layer 370 and the gate electrode layer 372 may be partially etched to form a blocking layer pattern 375 and a gate line 380.

In exemplary embodiments, upper portions of the blocking layer 370 and the gate electrode layer 372 may be planarized by a CMP process until an uppermost insulating interlayer pattern 306g is exposed. Portions of the gate electrode layer 372 formed in the opening 360 and on the top surface of the substrate 300 may be etched to obtain the blocking layer pattern 375 and the gate lines 380 (e.g., 380a to 380f).

The gate electrode layer 372 may be partially etched by a wet etching process using a hydrogen peroxide-containing solution, for example.

The gate lines 380 may include the GSL, the word line and the SSL sequentially stacked and spaced apart from one another in the first direction. For example, a lowermost gate line 380a may serve as the GSL. Four gate lines 380b to 380e on the GSL may serve as the word lines. An uppermost gate line 380f on the word line may serve as the SSL.

The gate line 380 at each level may surround the charge trap layer pattern 322, the tunnel insulation layer pattern 325 and the channel 340, and may extend in the second direction. The gate line 380 at each level may surround the predetermined number of the channel rows, e.g., four channel rows. Accordingly, a gate line structure may be formed by the gate lines 380 that are stacked in the first direction, surround the predetermined number of the channel rows and extend in the second direction.

Figure 36:
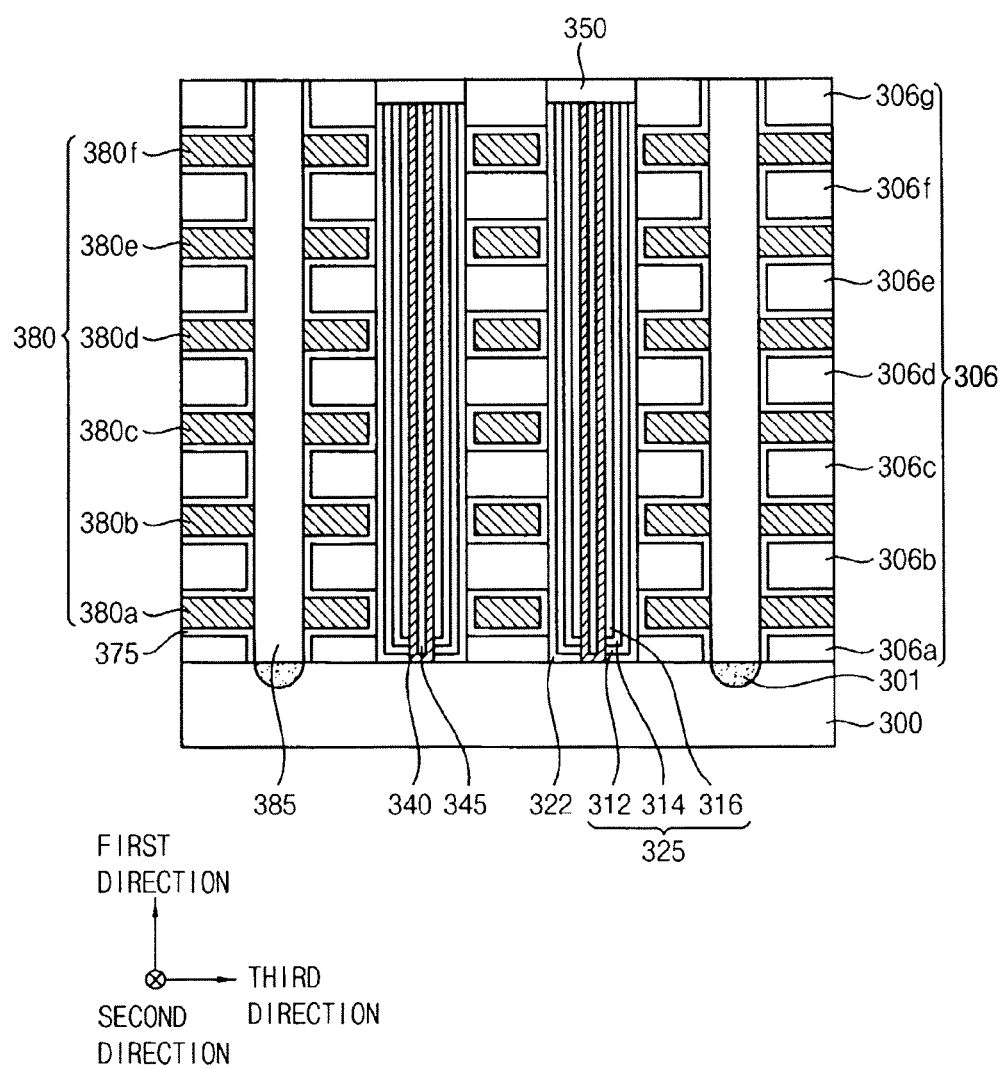

Referring to FIG. 36, an impurity region 301 may be formed in an upper portion of the substrate 300 exposed through the opening 360, and a second filling layer pattern 385 filling the opening 360 may be formed.

In exemplary embodiments, n-type impurities such as P or As may be implanted through the opening 360 to form the impurity region 301. The impurity region 301 may serve as a CSL extending in the second direction. In some embodiments, a metal silicide pattern (not illustrated) including, e.g., nickel silicide or cobalt silicide may be further formed on the impurity region 301 to reduce a resistance of the CSL.

A second filling layer sufficiently filling the opening 360 may be formed on the impurity region 301, the uppermost insulating interlayer pattern 306g and the pad 350. An upper portion of the second filling layer may be planarized by a CMP process or an etch-back process until the uppermost insulating interlayer pattern 306g is exposed to form a second filling layer pattern 385. The second filling layer may be formed of an insulating material silicon oxide, for example.

Figure 37:
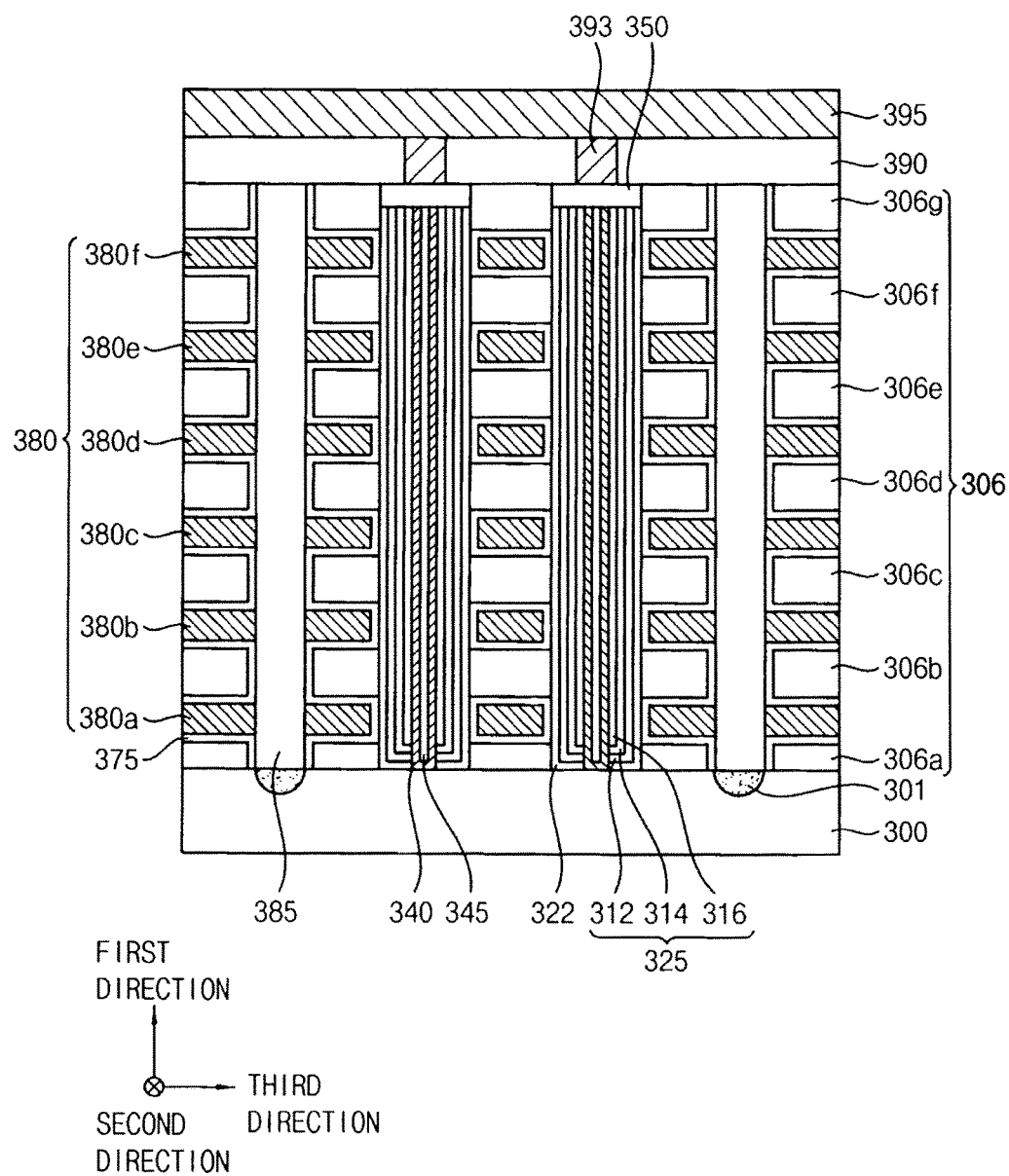

Referring to FIG. 37, an upper insulation layer 390 may be formed on the uppermost insulating interlayer pattern 306g, the second filling layer pattern 385 and the pad 350. The upper insulation layer 390 may be formed of an insulating material such as silicon oxide by a deposition process such as a CVD process.

A bit line contact 393 may be formed through the upper insulation layer 390 to be electrically connected to the pad 350. A bit line 395 electrically connected to the bit line contact 393 may be formed on the upper insulation layer 390.

A plurality of the bit line contacts 393 may be formed according to the arrangement of the channels 340 or the pads 350. The bit line 395 may extend in the third direction, and may be electrically connected to a plurality of the bit line contacts 393. A plurality of the bit lines 395 may be formed along the second direction.

The bit line contact 393 and the bit line 395 may be formed of metal or metal nitride by a sputtering process or an ALD process, for example.

According to exemplary embodiments as described above, a tunnel insulation layer included in a charge trap-type vertical memory device may be formed using an OSO-layered structure wherein a valence band offset of a band-gap is reduced so that an erase voltage of an erase operation is lowered, and a charge trap in the tunnel insulation layer may be minimized by using a silicon layer as an intermediate layer of the OSO-layered structure. In some exemplary embodiments, an oxide layer, a silicon layer and an oxide layer may be sequentially and successively formed by an in-situ ALD process. Supply times and flow rates of source gases may be controlled so that a thickness of each layer in the tunnel insulation layer may be finely adjusted.

Figure 38:
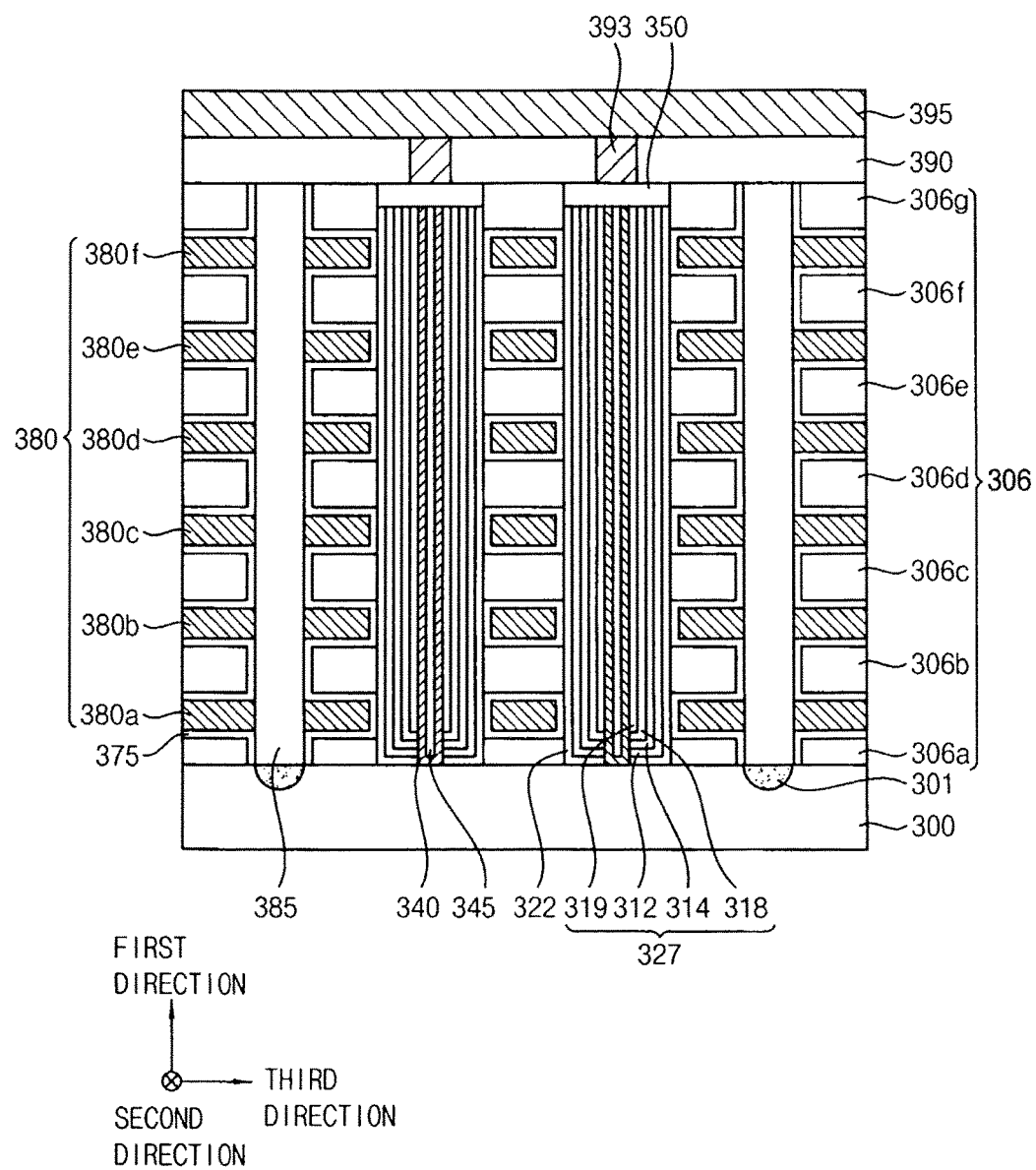
FIG. 38 is a cross-sectional view of a semiconductor device in accordance with exemplary embodiments of the present inventive concept.

FIG. 38 is a cross-sectional view illustrating a semiconductor device in accordance with some exemplary embodiments of the present inventive concept.

Detailed descriptions on structures and processes substantially the same as or similar to those illustrated with reference to FIG. 21 and FIGS. 22 to 37 are omitted herein. Like reference numerals are used to designate like elements.

Referring to FIG. 38, a tunnel insulation layer pattern 327 may include a first silicon oxide layer pattern 312, a silicon layer pattern 314, a silicon oxynitride layer pattern 318 and a second silicon oxide layer pattern 319 sequentially stacked from an inner sidewall of a charge trap layer pattern 322.

The oxynitride layer pattern 318 may have a thickness smaller than that of the silicon layer pattern 314, and may be interposed between the silicon layer pattern 314 and the second silicon oxide layer pattern 319. Therefore, a band-gap or an erase voltage may be further reduced by an addition of a nitrogen ingredient while preventing a charge trap in the tunnel insulation layer pattern 327.

For example, in a process for the formation of the tunnel insulation layer illustrated with reference to FIG. 26, a nitrogen containing flow including $NH_3$ and $N_2O$ may be introduced before providing the oxygen flow and the second hydrogen flow for the formation of the second silicon oxide layer 317. A supply time of the nitrogen containing flow may be shorter than that of the oxygen flow and the second hydrogen flow to form a silicon oxynitride layer on the silicon layer 315.

Figure 39:
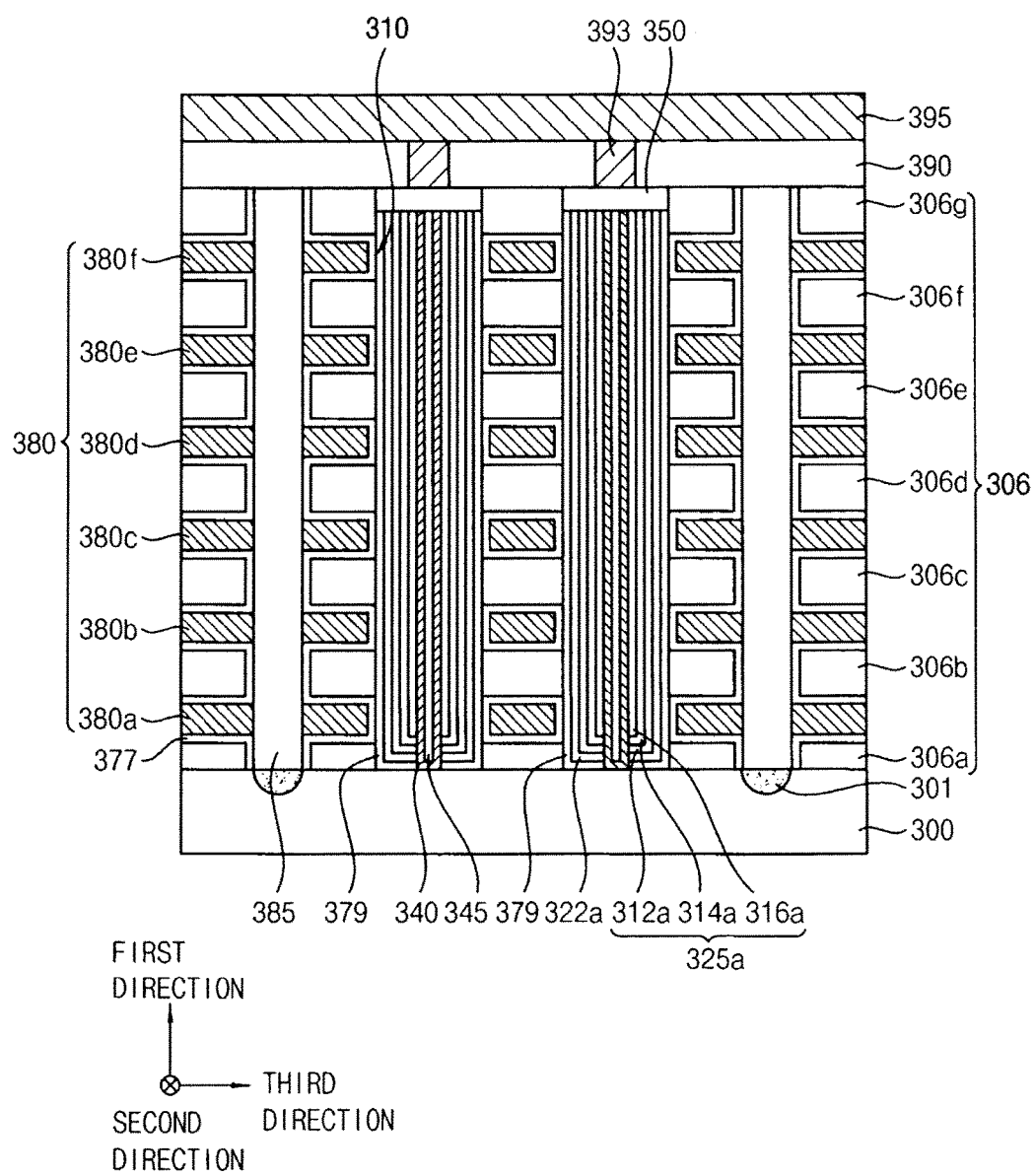
FIG. 39 is a cross-sectional view of a semiconductor device in accordance with exemplary embodiments of the present inventive concept.

FIG. 39 is a cross-sectional view illustrating a semiconductor device in accordance with some exemplary embodiments.

Detailed descriptions on structures and processes substantially the same as or similar to those illustrated with reference to FIG. 21 and FIGS. 22 to 37 are omitted herein. Like reference numerals are used to designate like elements.

Referring to FIG. 39, a first blocking layer pattern 379 may be disposed on a sidewall of a channel hole 310, and a charge trap layer pattern 322a may be disposed on the first blocking layer pattern 379. A tunnel insulation layer pattern 325a including a first silicon oxide layer pattern 312a, a silicon layer pattern 314a and a second silicon oxide layer pattern 316a may be disposed on the charge trap layer pattern 322a.

A second blocking layer pattern 377 may be formed between a gate line 380 and the first blocking layer pattern 379, and on surfaces of insulating interlayer patterns 306. The second blocking layer pattern 377 may have a shape and a structure substantially the same as the blocking layer pattern 375 illustrated in FIG. 21.

For example, in a process illustrated with reference to FIG. 25, a first blocking layer including silicon oxide or a metal oxide may be formed along a top surface of the mold structure, and the sidewall and a bottom of the channel hole 310 before forming the charge trap layer 311. Accordingly, as illustrated in FIG. 39, the first blocking layer pattern 379 may be formed on the sidewall of the channel hole 310, and the charge trap layer pattern 322a may be formed on the first blocking layer pattern 379.

In some exemplary embodiments, if the first blocking layer 379 is formed, the formation of the second blocking layer pattern 377 may be omitted. In this case, the gate line 380 at each level may be in contact with the insulating interlayer pattern 306 and the first blocking layer pattern 379.

Figure 40:
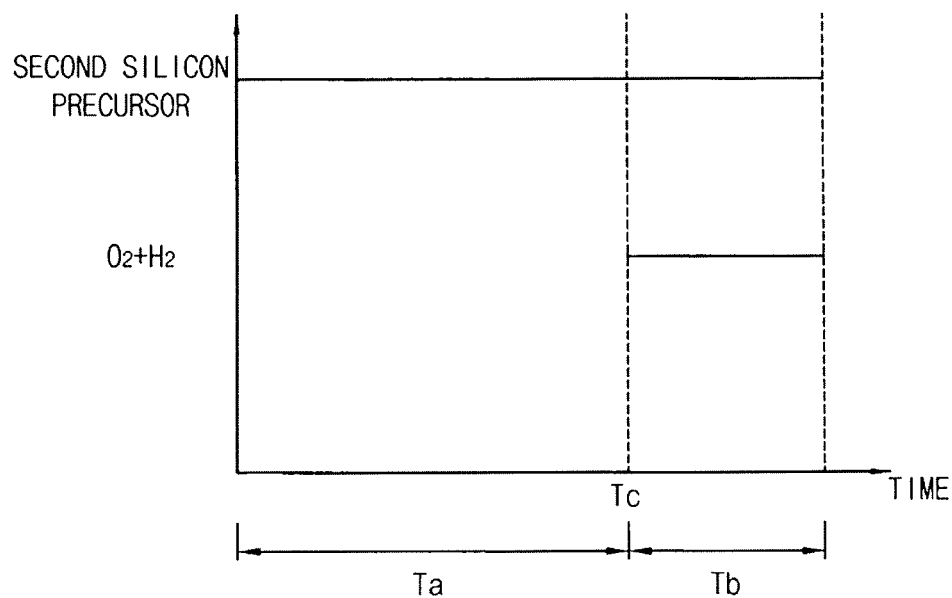
FIGS. 40 and 41 show deposition source gas profiles to form a second silicon oxide layer in accordance with exemplary embodiment of the present inventive concept.
Figure 41:
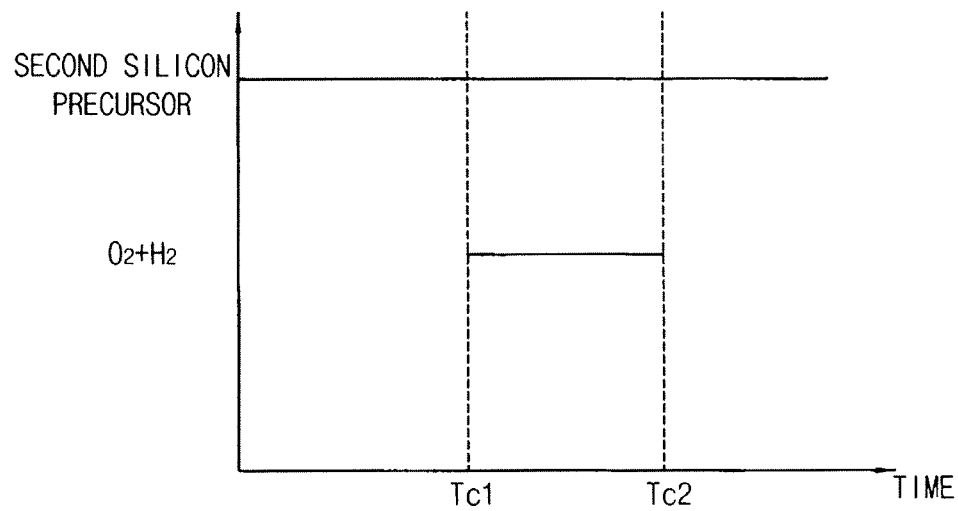

FIGS. 40 and 41 show deposition source gas flow profiles to form a second silicon oxide layer in accordance with some exemplary embodiments of the present inventive concept. For example, FIGS. 40 and 41 show deposition source gas profiles for the formation of the second silicon oxide layer 317 in a process illustrated with reference to FIG. 26.

Referring to FIG. 40, after the formation of the silicon layer 315 in FIG. 26, an introduction of the oxygen flow and the second hydrogen flow (denoted as "$O_2+H_2$" in FIG. 40) may be initiated from a specific critical time Tc while providing the second silicon precursor such as HCD continuously in an ALD process chamber. After the critical time Tc, the second silicon precursor may be continuously provided together with the oxygen flow and the second hydrogen flow.

As shown in FIG. 40, the introduction of the oxygen flow and the second hydrogen flow may be delayed for a time denoted as "Ta", so that the second silicon oxide layer 317 may be formed while preventing oxidation of the silicon layer 315.

In some exemplary embodiments, the supply time of the second silicon precursor (e.g., a sum of Ta and Tb) may be at least twice the supply time of the oxygen flow and the second hydrogen flow (e.g., Tb).

Referring to FIG. 41, the introduction of the oxygen flow and the second hydrogen flow may be initiated from a first time Tc1 to a second time Tc2 after the introduction of the second silicon precursor. The second silicon precursor may be continuously provided even after the second time Tc2. The introduction of the oxygen flow and the second hydrogen flow may intervene within a limited time so that the second silicon oxide layer 317 having a desired thickness may be formed while suppressing oxidation of the silicon layer 315.

Figure 42:
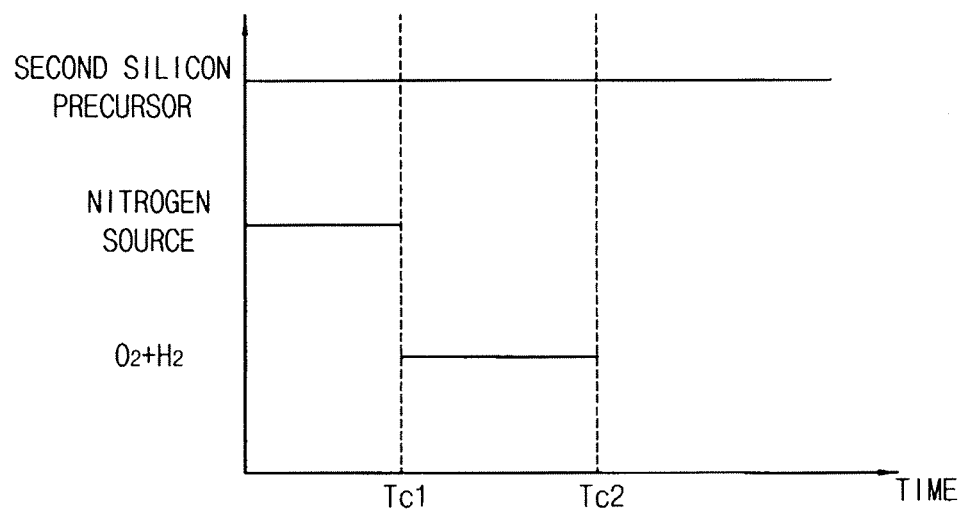
FIGS. 42 and 43 show deposition source gas profiles to form a silicon oxynitride layer and a second silicon oxide layer in accordance with exemplary embodiment of the present inventive concept.
Figure 43:
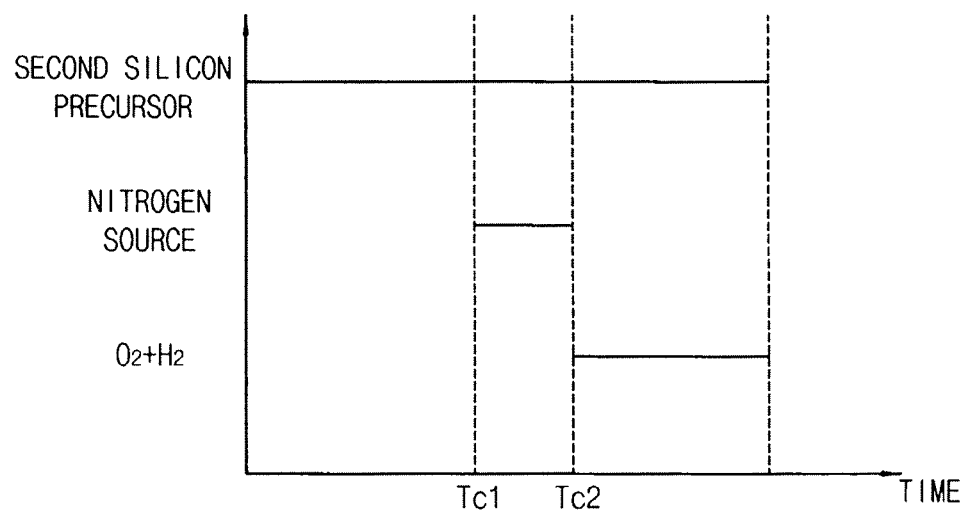

FIGS. 42 and 43 show deposition source gas profiles for forming a silicon oxynitride layer and a second silicon oxide layer. For example, FIGS. 42 and 43 show deposition source gas profiles for the formation of the silicon oxynitride layer 318 in a process illustrated with reference to FIG. 38.

Referring to FIG. 42, in a process illustrated with reference to FIG. 26, a nitrogen source including $NH_3$ and $N_2O$ may be provided until a first time Tc1 together with the second silicon precursor for the formation of the second silicon oxide layer 317. Accordingly, a thin silicon oxynitride layer may be additionally formed on the silicon layer 315.

The oxygen flow and the second hydrogen flow may be provided from the first time Tc1 to a second time Tc2 to form the second silicon oxide layer 317. A length until the first time Tc1 may be shorter than a length between the first time Tc1 to the second time Tc2. Thus, the silicon oxynitride layer may be thinner than each of the silicon layer 315 and the second silicon oxide layer 317.

The second silicon precursor may be provided continuously for a predetermined time even after the second time Tc2.

Referring to FIG. 43, the nitrogen source may be provided for a period between a first time Tc1 and a second time Tc2 after the introduction of the second silicon precursor. Accordingly, a thin silicon oxynitride layer may be formed on the silicon layer 315. After the second time Tc2, the oxygen flow and the second hydrogen flow may be introduced together with the second silicon precursor to form the second silicon oxide layer 317 on the silicon oxynitride layer.

A length between the first time Tc1 and the second time Tc2 may be shorter than a length after the second time Tc2. Thus, the silicon oxynitride layer may be thinner than each of the silicon layer 315 and the second silicon oxide layer 317.

According to exemplary embodiments of the present inventive concept, an OSO-layered structure including an oxide layer-a silicon layer-an oxide layer may be employed as a tunnel insulation layer of planar-type or vertical-type non-volatile memory devices. The silicon layer may be thinner than the oxide layer, and may have small valence band offset of a band-gap at the interface between the silicon layer and the oxide layer, and may have a low charge trap property compared to nitride. Therefore, a charge loss and an erase voltage of the memory device may be reduced, and operational and mechanical reliability of the memory device may increase.

In an exemplary embodiment, the floating gate electrode of FIGS. 1 and 2 and the charge trap layer pattern 322 of FIGS. 21, 34-38 and the charge trap layer pattern 322a of FIG. 39 may serve to store charges in a write operation, and in a read operation, an amount of such charges may be read out. The floating gate electrode of FIGS. 1 and 2 and the charge trap layer pattern 322 of FIGS. 21, 34-38 and the charge trap layer pattern 322a of FIG. 39 may be referred to as a charge storage layer pattern.

In an exemplary embodiment,

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a substrate;
a tunnel insulation layer disposed on the substrate, the tunnel insulation layer including:
a first silicon oxide layer;
a second silicon oxide layer; and
a silicon layer interposed between the first silicon oxide layer and the second silicon oxide layer, the silicon layer having a thickness smaller than a thickness of each of the first silicon oxide layer and the second silicon oxide layer; and
a gate pattern disposed on the tunnel insulation layer.

2. The semiconductor device of claim 1,
wherein the tunnel insulation layer further includes a silicon oxynitride layer interposed at least one of between the first silicon oxide layer and the silicon layer, and between the silicon layer and the second silicon oxide layer.

3. The semiconductor device of claim 2,
wherein the silicon oxynitride layer has a thickness smaller than the thickness of the silicon layer.

4. The semiconductor device of claim 1,
wherein the gate pattern includes a floating gate, a dielectric layer pattern and a control gate sequentially stacked on the tunnel insulation layer.

5. The semiconductor device of claim 4,
wherein the floating gate includes polysilicon.

6. The semiconductor device of claim 4,
wherein the dielectric layer pattern includes an oxide-nitride-oxide layered structure.

7. The semiconductor device of claim 1,
wherein the gate pattern includes a charge trap layer pattern, a blocking layer pattern and a gate electrode sequentially stacked on the tunnel insulation layer.

8. The semiconductor device of claim 7,
wherein the charge trap layer pattern and the blocking layer pattern include nitride and oxide, respectively.

9. The semiconductor device of claim 1,
wherein the gate pattern includes a plurality of gate patterns, and
a thickness of a portion of the tunnel insulation layer between the gate patterns neighboring each other is smaller than a thickness of a portion of the tunnel insulation layer under the gate pattern.

10. A semiconductor device, comprising:
a substrate;
a plurality of insulating interlayers and a plurality of gate lines disposed on the substrate,
wherein each insulating interlayer and each gate line are alternately and repeatedly stacked on the substrate;
a plurality of channel holes penetrating through the insulating interlayers and the gate lines;
a charge trap layer disposed on a sidewall of each channel hole;
a tunnel insulation layer disposed on the charge trap layer, the tunnel insulation layer including:
a first silicon oxide layer;
a second silicon oxide layer; and
a silicon layer interposed between the first silicon oxide layer and the second silicon oxide layer, the silicon layer having a thickness smaller than a thickness of each of the first silicon oxide layer and the second silicon oxide layer; and
a plurality of channels, each of which is disposed on the tunnel insulation layer and in the each channel hole.

11. The semiconductor device of claim 10,
wherein a thickness of the first silicon oxide layer is greater than a thickness of the second silicon oxide layer.

12. The semiconductor device of claim 10,
wherein the tunnel insulation layer further includes a silicon oxynitride layer interposed between the silicon layer and the second silicon oxide layer.

13. The semiconductor device of claim 12,
wherein a thickness of the silicon oxynitride layer is smaller than the thickness of the silicon layer.

14. The semiconductor device of claim 10, further comprising a blocking layer interposed between the sidewall of the channel hole and the charge trap layer, the blocking layer including oxide.

15. The semiconductor device of claim 10, further comprising a blocking layer formed along inner sidewalls, upper surfaces and lower surfaces of the gate lines.

16. The semiconductor device of claim 10,
   wherein the channels protrude from a top surface of the substrate, and the channels are physically spaced apart from each other.

17. The semiconductor device of claim 16,
   wherein a combined structure of the charge trap layer and the tunnel insulation layer has a straw shape surrounding the channel.

* * * * *